United States Patent
Ma et al.

(10) Patent No.: US 11,257,932 B2
(45) Date of Patent: Feb. 22, 2022

(54) FIN FIELD EFFECT TRANSISTOR DEVICE STRUCTURE AND METHOD FOR FORMING THE SAME

(71) Applicant: Taiwan Semiconductor Manufacturing Co., Ltd., Hsinchu (TW)

(72) Inventors: Ta-Chun Ma, New Taipei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/900,105

(22) Filed: Jun. 12, 2020

(65) Prior Publication Data

US 2021/0242332 A1 Aug. 5, 2021

Related U.S. Application Data

(60) Provisional application No. 62/967,731, filed on Jan. 30, 2020.

(51) Int. Cl.
| | |
|---|---|
| *H01L 29/66* | (2006.01) |
| *H01L 21/02* | (2006.01) |
| *H01L 29/10* | (2006.01) |
| *H01L 29/78* | (2006.01) |

(52) U.S. Cl.
CPC .. *H01L 29/66795* (2013.01); *H01L 21/02667* (2013.01); *H01L 29/1041* (2013.01); *H01L 29/7851* (2013.01)

(58) Field of Classification Search
CPC ......... H01L 29/66795; H01L 21/02667; H01L 29/1041; H01L 29/7851; H01L 21/02532; H01L 21/0262
USPC ......................................................... 438/149
See application file for complete search history.

(56) References Cited

U.S. PATENT DOCUMENTS

| | | | | |
|---|---|---|---|---|
| 2002/0036290 | A1* | 3/2002 | Inaba | H01L 29/42384 257/66 |
| 2003/0227036 | A1* | 12/2003 | Sugiyama | H01L 29/42384 257/288 |
| 2004/0031979 | A1* | 2/2004 | Lochtefeld | H01L 29/78687 257/233 |
| 2004/0195624 | A1* | 10/2004 | Liu | H01L 29/66795 257/347 |
| 2005/0035415 | A1* | 2/2005 | Yeo | H01L 29/66795 257/401 |

(Continued)

*Primary Examiner* — Sheikh Maruf
(74) *Attorney, Agent, or Firm* — Birch, Stewart, Kolasch & Birch, LLP

(57) ABSTRACT

A method for forming a fin field effect transistor device structure includes forming a fin structure over a substrate. The method also includes forming an isolation structure surrounding the fin structure. The method also includes cleaning sidewalls of the fin structure. The method also includes depositing a silicon cap layer over the fin structure. The method also includes growing an oxide layer over the silicon cap layer. The silicon cap layer is thinned after growing an oxide layer over the silicon cap layer. The method also includes forming a gate structure over the oxide layer across the fin structure. The method also includes growing a source/drain epitaxial structure beside the gate structure. The method also includes forming a contact structure electrically connected to the gate structure.

20 Claims, 32 Drawing Sheets

(56) References Cited

U.S. PATENT DOCUMENTS

| | | | |
|---|---|---|---|
| 2005/0077553 A1* | 4/2005 | Kim | H01L 21/823437 257/288 |
| 2005/0130358 A1* | 6/2005 | Chidambarrao | H01L 21/823821 438/197 |
| 2005/0224800 A1* | 10/2005 | Lindert | H01L 29/1054 257/66 |
| 2007/0284583 A1* | 12/2007 | Saito | H01L 29/66803 257/66 |
| 2010/0276693 A1* | 11/2010 | Lenoble | H01L 29/7851 257/66 |
| 2012/0018730 A1* | 1/2012 | Kanakasabapathy | H01L 27/0886 257/66 |
| 2015/0332977 A1* | 11/2015 | Cheng | H01L 21/845 438/157 |
| 2018/0019339 A1* | 1/2018 | Colinge | H01L 29/665 |

* cited by examiner

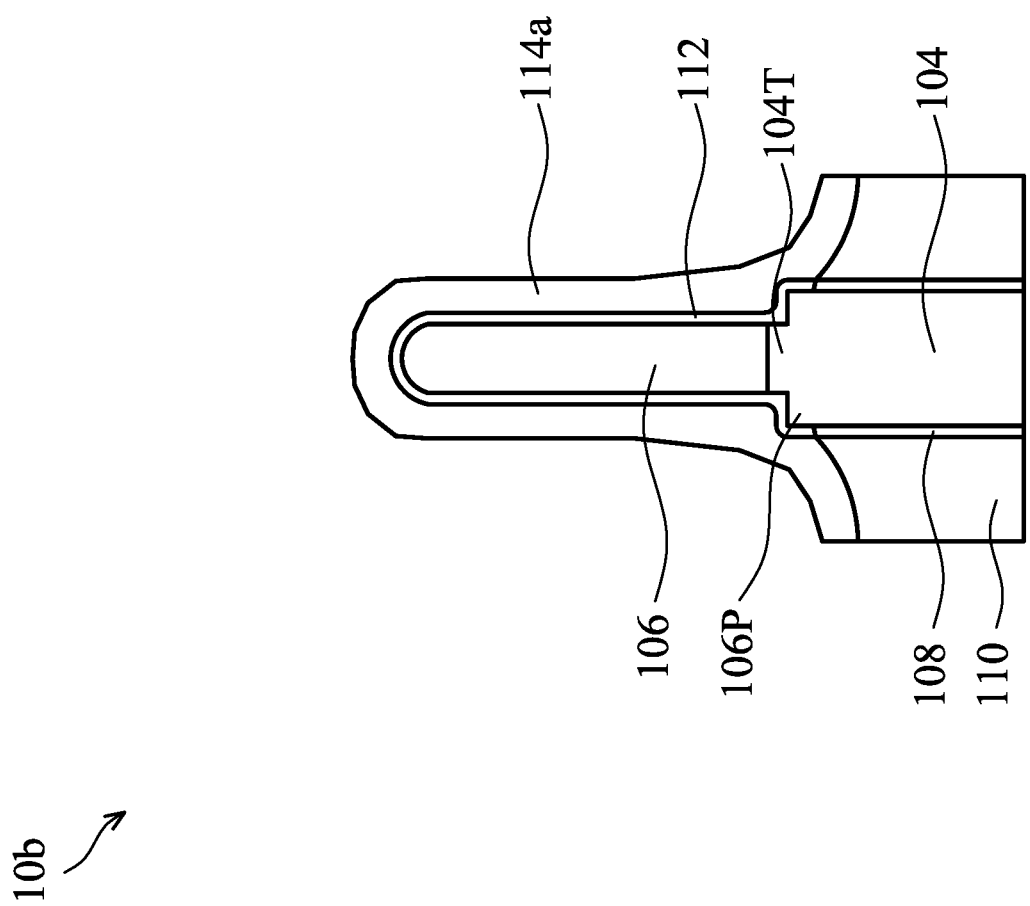

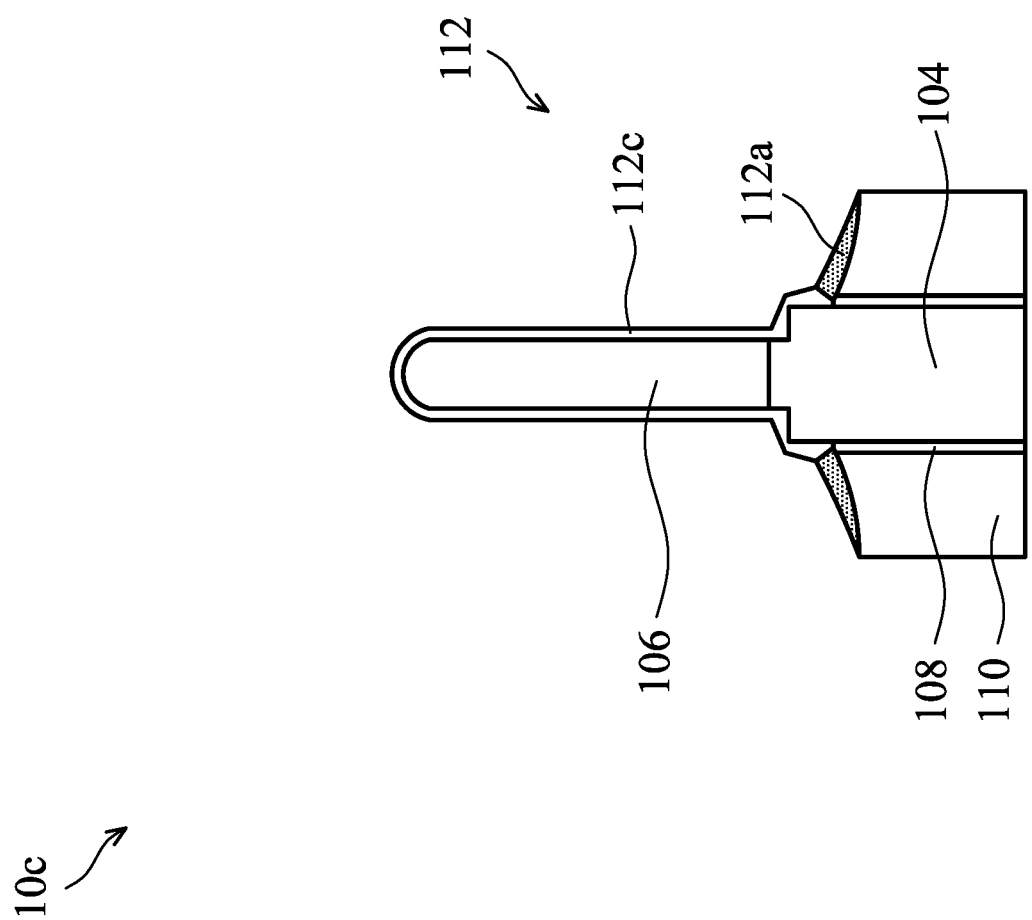

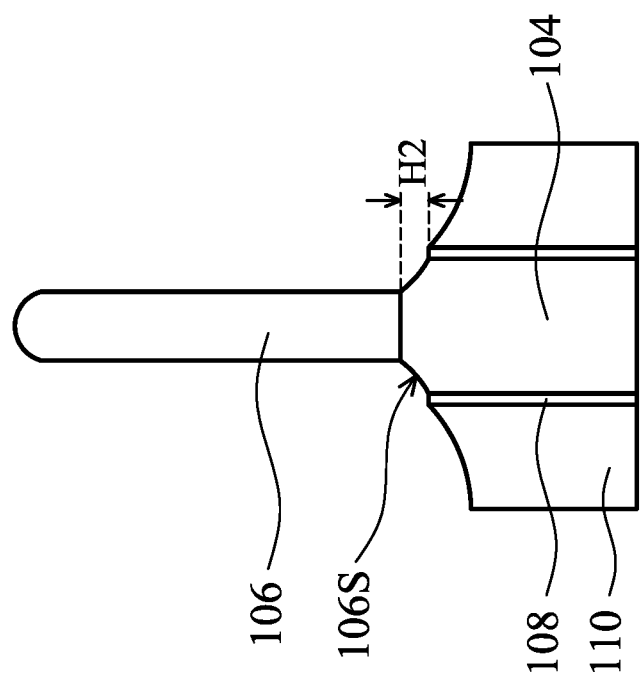

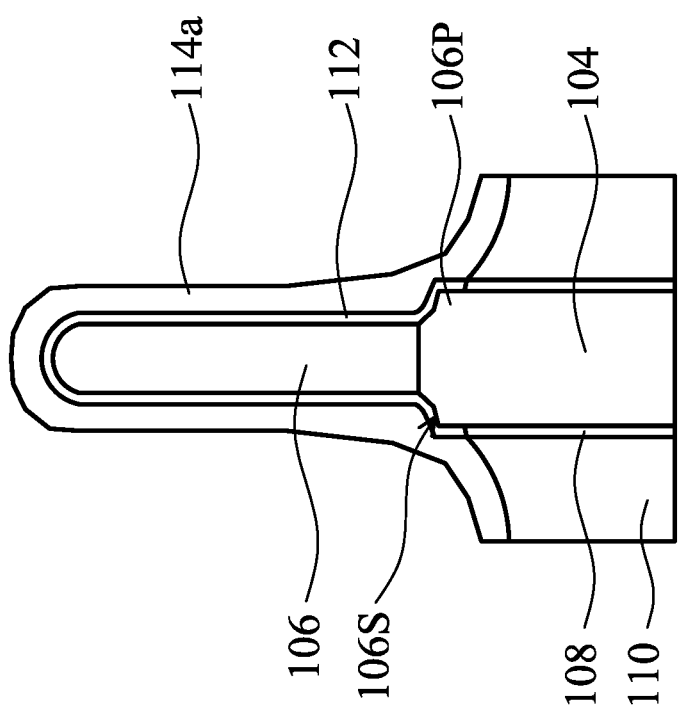

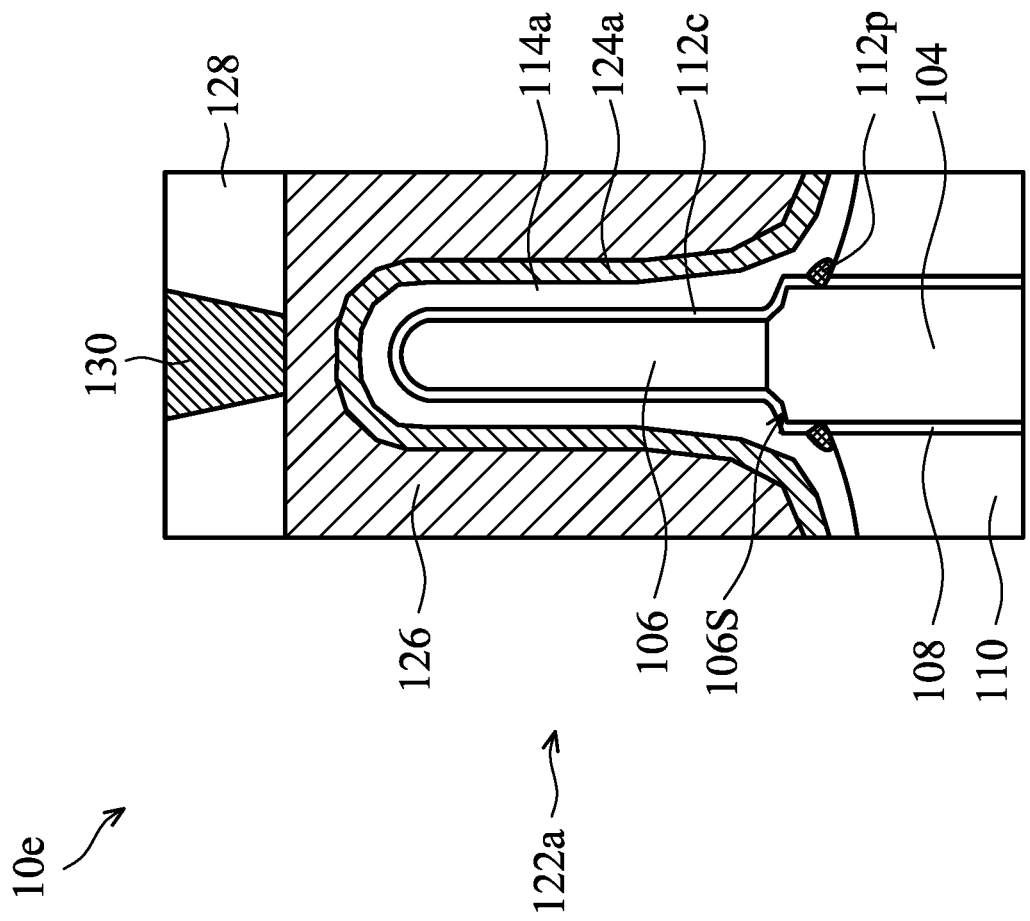

FIN FIELD EFFECT TRANSISTOR DEVICE STRUCTURE AND METHOD FOR FORMING THE SAME

CROSS REFERENCE TO RELATED APPLICATIONS

This application claims the benefit of U.S. Provisional Application No. 62/967,731, filed on Jan. 30, 2020, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2F-1 and 2G-1 are perspective representations of a FinFET device structure, in accordance with some embodiments of the disclosure.

FIGS. 3A-3G are cross-sectional representations of various stages of forming a modified FinFET device structure, in accordance with some embodiments of the disclosure.

FIGS. 4A-4C are cross-sectional representations of various stages of forming a modified FinFET device structure, in accordance with some embodiments of the disclosure.

FIGS. 5A-5F are cross-sectional representations of various stages of forming a modified FinFET device structure, in accordance with some embodiments of the disclosure.

FIGS. 6A-6C are cross-sectional representations of various stages of forming a modified FinFET device structure, in accordance with some embodiments of the disclosure.

DETAILED DESCRIPTION

Figure 1:
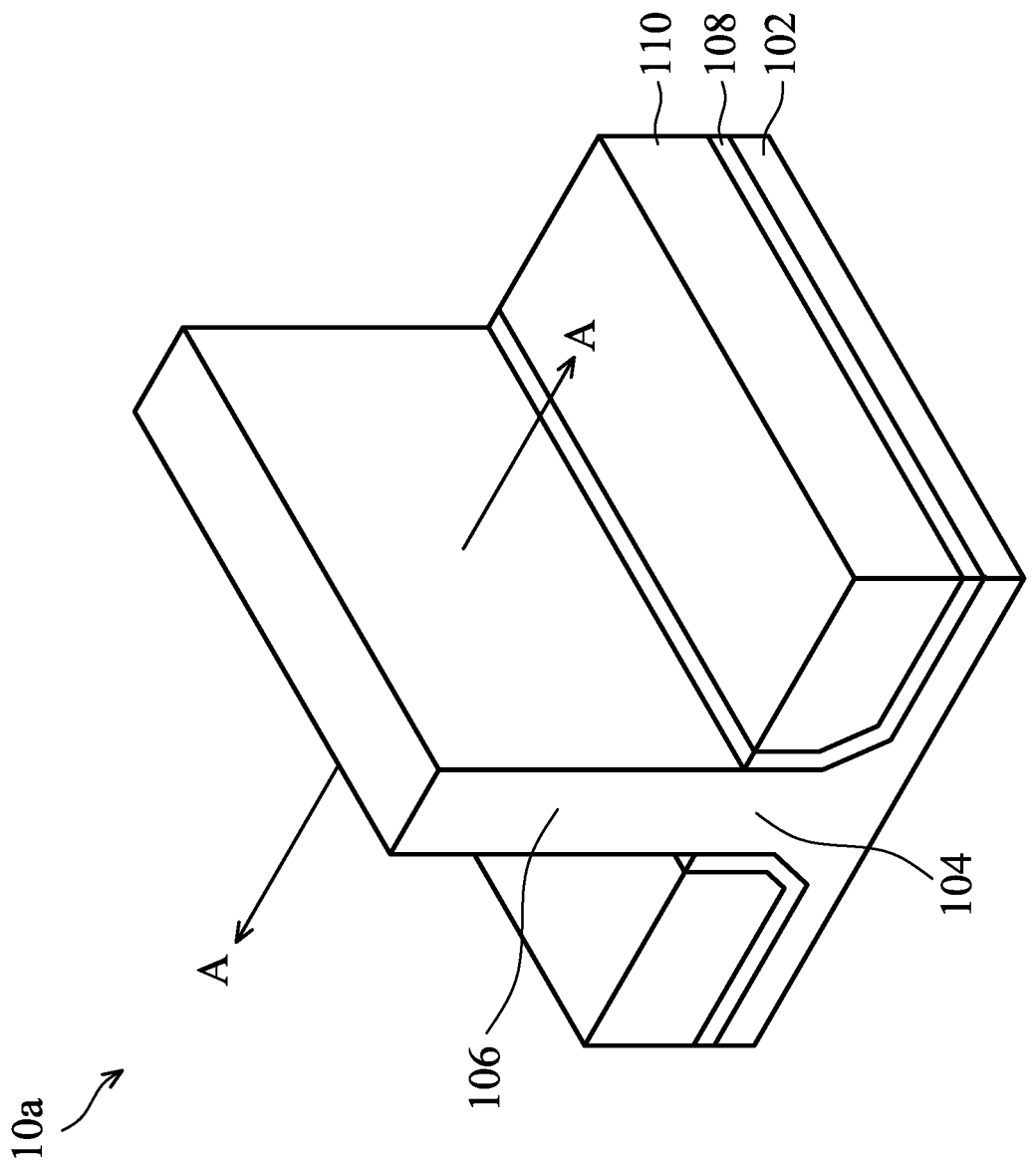
FIG. 1 is a perspective representation of a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a fin field effect transistor (FinFET) device structure are provided. The method for forming the FinFET device structure may include forming a cap layer over the fin structure. After growing a gate dielectric layer over the cap layer, the cap layer may be consumed but remain over the fin structure. With the protection of the cap layer, the width of the fin structure may remain after growing the oxide layer. Therefore, the width of the fin structure may be precisely controlled.

FIG. 1 is a perspective representation of a FinFET device structure 10a, in accordance with some embodiments of the disclosure. FIGS. 2A-2E, 2F-2, 2G-2 are cross-sectional representations of various stages of forming a FinFET device structure 10a, in accordance with some embodiments of the disclosure. FIGS. 2A-2E, 2F-2, 2G-2 show cross-sectional representations taken along line A-A in FIG. 1.

A substrate 102 is provided as shown in FIG. 1 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may have an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, as shown in FIG. 1, a doped region 104 is formed in the substrate 102, in accordance with some embodiments. In some embodiments, the doped region 104 is an anti-punch-through (APT) region. The APT region may be used to offer greater protection against punch-through. As a result, current leakage caused by punch-through may be reduced or prevented.

In some embodiments, an ion implantation process is performed to dope the substrate 102 with suitable dopants for forming the doped region 104, as shown in FIG. 1. Since the ion implantation process for forming the APT region may be performed before forming the fin structure, the subsequently formed fin structure may be prevented from being damaged by the ion implantation process. Therefore, device quality and reliability may be improved.

In some embodiments, the concentration of dopants in the doped region 104 is in a range from about 1E18 atoms/$cm^3$ to about 1E19 atoms/$cm^3$. In some embodiments, the concentration of the dopants in the doped region 104 is in a range from about 3E18 atoms/$cm^3$ to about 1E20 atoms/$cm^3$. Because the doped region 104 is formed before the formation of the fin structure, the concentration of dopants in the doped region 104 may be increased without damaging the fin structure. The concentration of dopants in the doped region 104 may be fine-tuned depending on requirements. If the dopant concentration is too low, the current leakage caused by punch-through may increase.

In some embodiments, the doped region 104 is a p-type doped region. The doped region 104 may be a portion of the substrate 102 doped with one or more p-type dopants. For example, the p-type dopant may be boron. NMOS FinFET devices may be formed over the doped region 104.

In some embodiments, the doped region 104 is an n-type doped region. The doped region 104 may be a portion of the substrate 102 doped with one or more n-type dopants. For example, the n-type dopant may be phosphor or arsenic. PMOS FinFET devices may be formed over the doped region 104.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon nitride, silicon oxide, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Figure 2A:
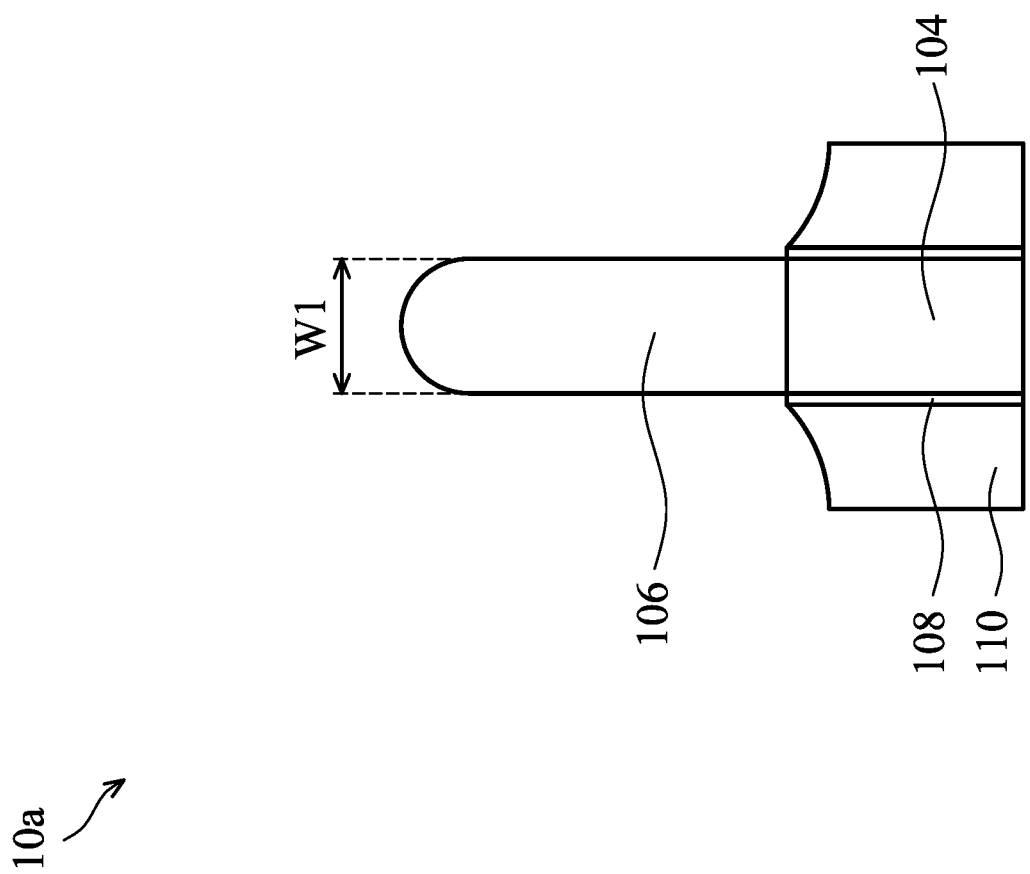
FIGS. 2A-2E, 2F-2, 2G-2 are cross-sectional representations of various stages of forming a FinFET device structure, in accordance with some embodiments of the disclosure.

Afterwards, an etching process is performed on the substrate 102 to form a fin structure 106 by using the hard mask layer as a mask as shown in FIGS. 1 and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 106 reaches a predetermined height. As shown in FIGS. 1 and 2A, the bottom of the fin structure 106 is in the doped region 104. As shown in FIG. 2A, the fin structure has a width of W1.

Next, a liner layer 108 is conformally formed on the sidewalls and the top surface of the fin structure 106 as shown in FIGS. 1 and 2A in accordance with some embodiments. The liner layer 108 may prevent silicon in the fin structure 106 from being oxidized in the subsequent process for forming oxide over the liner layer 108. The liner layer 108 may be used to protect the fin structure 106 from being damaged in the following processes (such as an anneal process or an etching process). The liner layer 108 may be made of SiN, SiOx, SiON, SiCN, or a combination thereof. In some embodiments, the liner layer 108 has a thickness in a range of about 3 Å to about 50 Å.

Next, an isolation layer 110 is formed to cover the fin structure 106 and the substrate 102 as shown in FIGS. 1 and 2A in accordance with some embodiments. The isolation layer 110 may be made of silicon oxide, silicon nitride, silicon oxynitride, fluoride-doped silicate glass (FSG), or another low-k dielectric material. The isolation layer 110 may be deposited by a deposition process, such as a chemical vapor deposition (CVD) process such as low pressure CVD (LPCVD), plasma enhanced CVD (PECVD), or high density plasma CVD (HDP-CVD), high aspect ratio process (HARP), flowable CVD (FCVD), atomic layer deposition (ALD), a spin-on-glass process, or another applicable process, or a combination thereof.

Afterwards, the isolation layer 110 may be planarized to expose the top surface of the patterned hard mask layer (not shown). The isolation layer 110 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 110, as shown in FIGS. 1 and 2A in accordance with some embodiments. The etching process may be used to remove a portion of the liner layer and a portion of the isolation layer 110. As a result, the top portion of the fin structure 106 may be exposed and the remaining isolation layer 110 may surround the base portion of the fin structure 106. The remaining isolation layer 110 may be an isolation structure 110 such as a shallow trench isolation (STI) structure surrounding the bottom portion of the fin structure 106. In some embodiments as shown in FIGS. 1 and 2A, the isolation structure 110 surrounds the doped region 104 in the fin structure 106. The isolation structure 110 may be configured to prevent electrical interference or crosstalk.

Figure 2B:
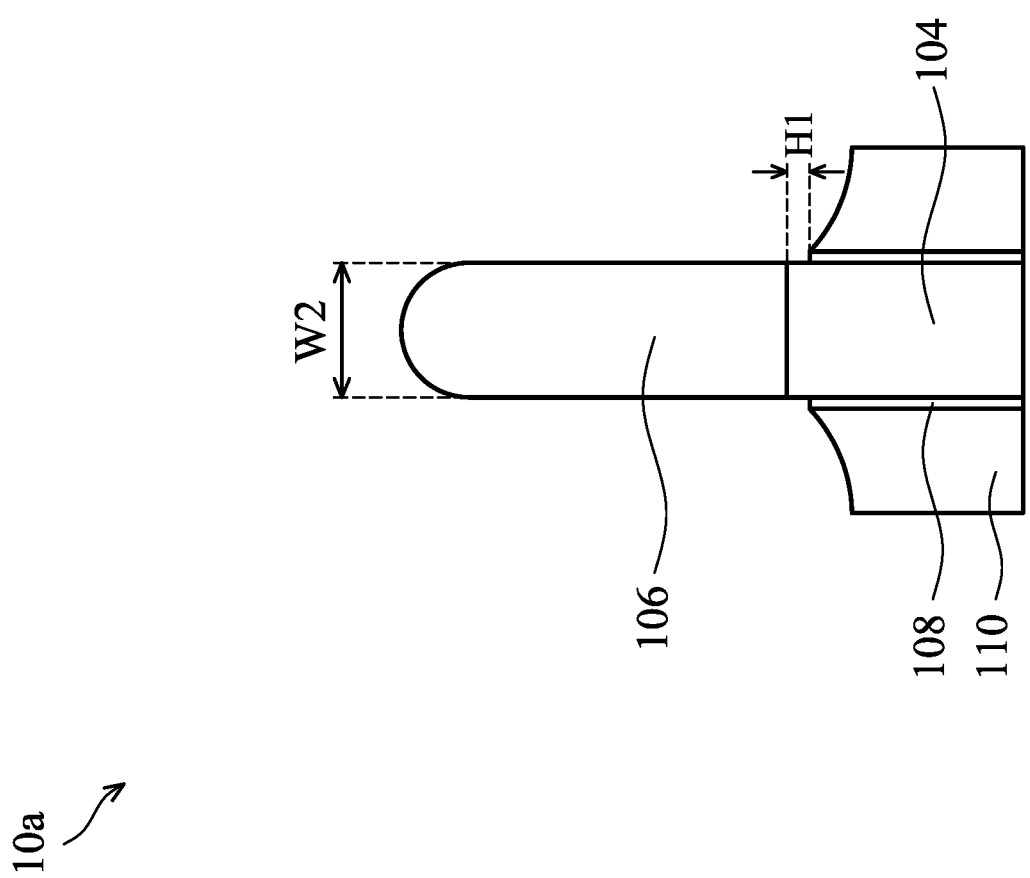

Next, a cleaning process is performed on the fin structure 106, the liner layer 108, and the isolation structure 110, as shown in FIG. 2B in accordance with some embodiments. The cleaning process may remove the native oxide layer grown on the fin structure 106. The clean process may be a wet cleaning process or a dry cleaning process. The wet cleaning process may use wet etching etchant such as hydrofluoric acid (HF). The dry cleaning process may also include dry cleaning using etchant gas such as $SiF_6$ with plasma, combination of plasma treated-$NF_3$/$NH_3$ or plasma treated-$NF_3$ and $NH_3$, or HF/$NH_3$ mixing gas.

In some embodiments, the liner layer 108 and the isolation structure 110 are recessed by the cleaning process. In some embodiments as shown in FIG. 2B, the doped region 104 is exposed after the cleaning process. In some embodiments as shown in FIG. 2B, the recessed height H1 of the liner layer 108 and the isolation structure 110 is in a range of about 6 Å to about 80 Å. In some embodiments, the recessed height H1 of the liner layer 108 and the isolation structure 110 is in a range of about 10 Å to about 60 Å. In some embodiments, the recessed height H1 of the liner layer 108 and the isolation structure 110 is in a range of about 20 Å to about 50 Å. If the recessed height H1 of the liner layer 108 and the isolation structure 110 is too great, the channel of FinFET device structure 10a may include the doped region 104 and device performance may degrade.

As shown in FIG. 2B, the fin structure 106 has a width of W2 after the cleaning process. In some embodiments, the width W1 of the fin structure 106 before the cleaning process and the width W2 of the fin structure 106 after the cleaning process are substantially the same. For example, the difference of the width W1 and the width W2 is in a range of about 3 Å to about 50 Å.

Figure 2C:
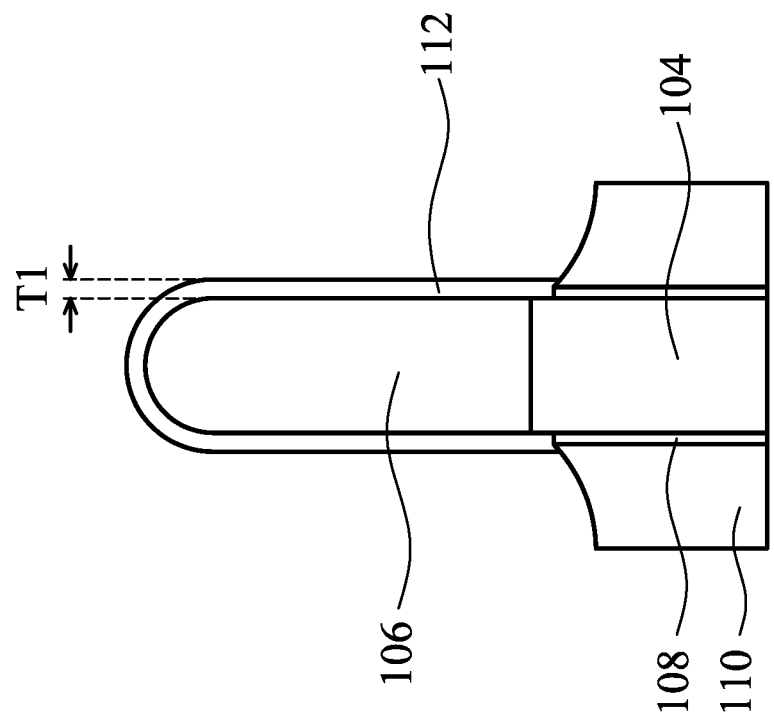

Next, a cap layer 112 is formed over the fin structure 106 as shown in FIG. 2C in accordance with some embodiments. In some embodiments, the cap layer 112 and the fin structure 106 are made of the same material. Therefore, the cap layer 112 and the fin structure 106 may be indistinguishable since both of them are crystalline in nature. However, the boundary between the cap layer 112 and the fin structure 106 is still shown by a dashed line for clarity. In some embodiments, the cap layer 112 is made of silicon.

In some embodiments as shown in FIG. 2C, the cap layer 112 is selectively grown over the sidewalls and the top surface of the fin structure 106. In some embodiments, the cap layer 112 is epitaxially grown. The cap layer 112 may be grown by a chemical vapor deposition (CVD) process such as a plasma-enhanced CVD (PECVD) process. The precursors such as silane ($SiH_4$), disilane ($Si_2H_6$), trisilane ($Si_3H_8$), dichlorosilane ($SiH_2Cl_2$), trichlorosilane ($SiHCl_3$), or other silicon-containing precursors may be employed when growing the cap layer 112. If the cap layer 112 is grown by CVD or PECVD, the cap layer 112 may be grown under a temperature in a range of about 250° C. to about 700° C. If the cap layer 112 is grown by CVD or PECVD, the cap layer 112 may be grown under a pressure in a range of about 1 Torr to about 760 Torr. If the temperature or the pressure is too high, the cap layer 112 may be also grown over the isolation structure 110 and there may be leakage path in the cap layer 112 and the performance may be degraded. If the temperature or the pressure is too low, the cap layer 112 may not be grown. As shown in FIG. 2C, the cap layer has a thickness T1.

The cap layer 112 may be grown by an atomic layer deposition (ALD) process such as a plasma-enhanced ALD (PEALD) process. The ALD process may be performed by cyclic deposition including a self-limiting Si monolayer formation step and a hydrogen desorption step, for example. If the cap layer 112 is grown by ALD or PEALD, the cap layer 112 may be grown under a temperature in a range of about 250° C. to about 600° C. If the cap layer 112 is grown by ALD or PEALD, the cap layer 112 may be grown under a pressure in a range of about 10 mTorr to about 700 mTorr. If the temperature or the pressure is too high, the cap layer 112 may be also grown on the isolation structure 110 and there may be leakage path in the cap layer 112 and the performance may be degraded. If the temperature or the pressure is too low, the cap layer 112 may not be grown.

Figure 2D:
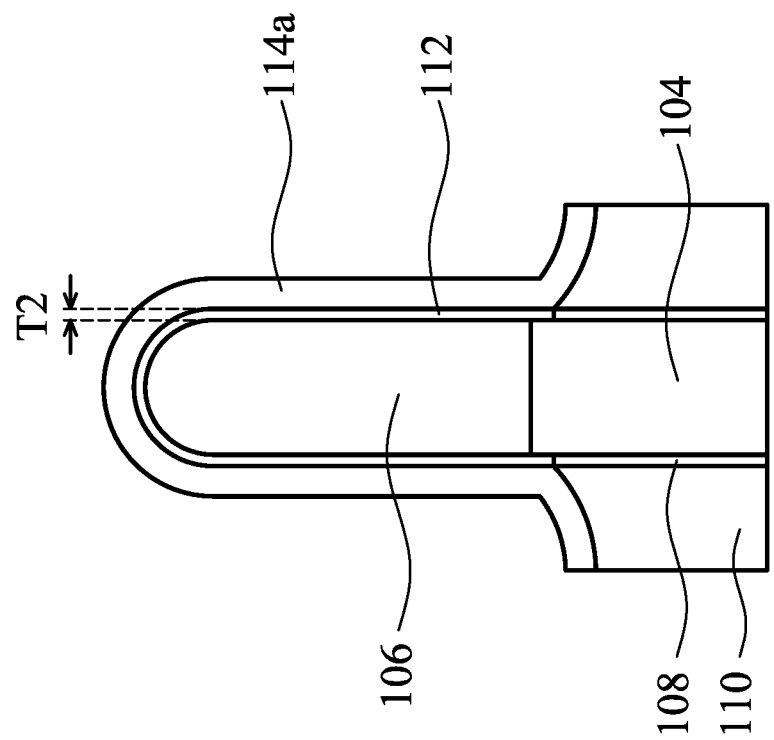

Next, a gate dielectric layer 114a is conformally formed over and across the fin structure 106, the liner layer 108, and the isolation structure 110 as shown in FIG. 2D in accordance with some embodiments. The gate dielectric layer 114a may be made of dielectric materials, such as silicon oxide, silicon nitride, silicon oxynitride, dielectric material (s) with high dielectric constant (high-k), or a combination thereof. In some embodiments, the gate dielectric layer is made of silicon oxide. The gate dielectric layer 114a may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

As shown in FIG. 2D, the cap layer 112 has a thickness T2 after forming the gate dielectric layer 114a. In some embodiments, the thickness T2 of the cap layer 112 after forming the gate dielectric layer 114a is in a range of about 1 Å to about 30 Å. In some embodiments, the thickness T2 of the cap layer 112 after forming the gate dielectric layer 114a is in a range of about 2 Å to about 20 Å. In some embodiments, the thickness T2 of the cap layer 112 after forming the gate dielectric layer 114a is in a range of about 2 Å to about 8 Å. If the thickness T2 of the cap layer 112 after forming the gate dielectric layer 114a is too thick, the device performance may degrade. If the thickness T2 of the cap layer 112 after forming the gate dielectric layer 114a is too thin, the fin structure 106 may be damaged and there may be mechanical integrity issues or carrier mobility may degrade.

During the formation of the gate dielectric layer 114a, the cap layer 112 may be consumed or oxidized. In some embodiments, the thickness T1 of the cap layer 112 before forming the gate dielectric layer 114a is greater than the thickness T2 of the cap layer 112 after forming the gate dielectric layer 114a. In some embodiments, the difference between the thickness T1 of the cap layer 112 and the thickness T2 of the cap layer 112 is less than 10 Å. In some embodiments, the difference between the thickness T1 of the cap layer 112 and the thickness T2 of the cap layer 112 is less than 5 Å. In some embodiments, the difference between the thickness T1 of the cap layer 112 and the thickness T2 of the cap layer 112 is less than 1 Å. If the difference between the thickness T1 of the cap layer 112 and the thickness T2 of the cap layer 112 is too great, the cap layer 112 is consumed too much during the formation of the gate dielectric layer 114a, therefore, the fin structure 106 may be damaged and there may be mechanical integrity issues or carrier mobility may degrade.

It should be noted that although in FIG. 2D the sidewall of the cap layer 112 is aligned with the sidewall of the liner layer 108. The sidewall of the cap layer 112 may also be misaligned with the sidewall of the liner layer 108.

Figure 2E:
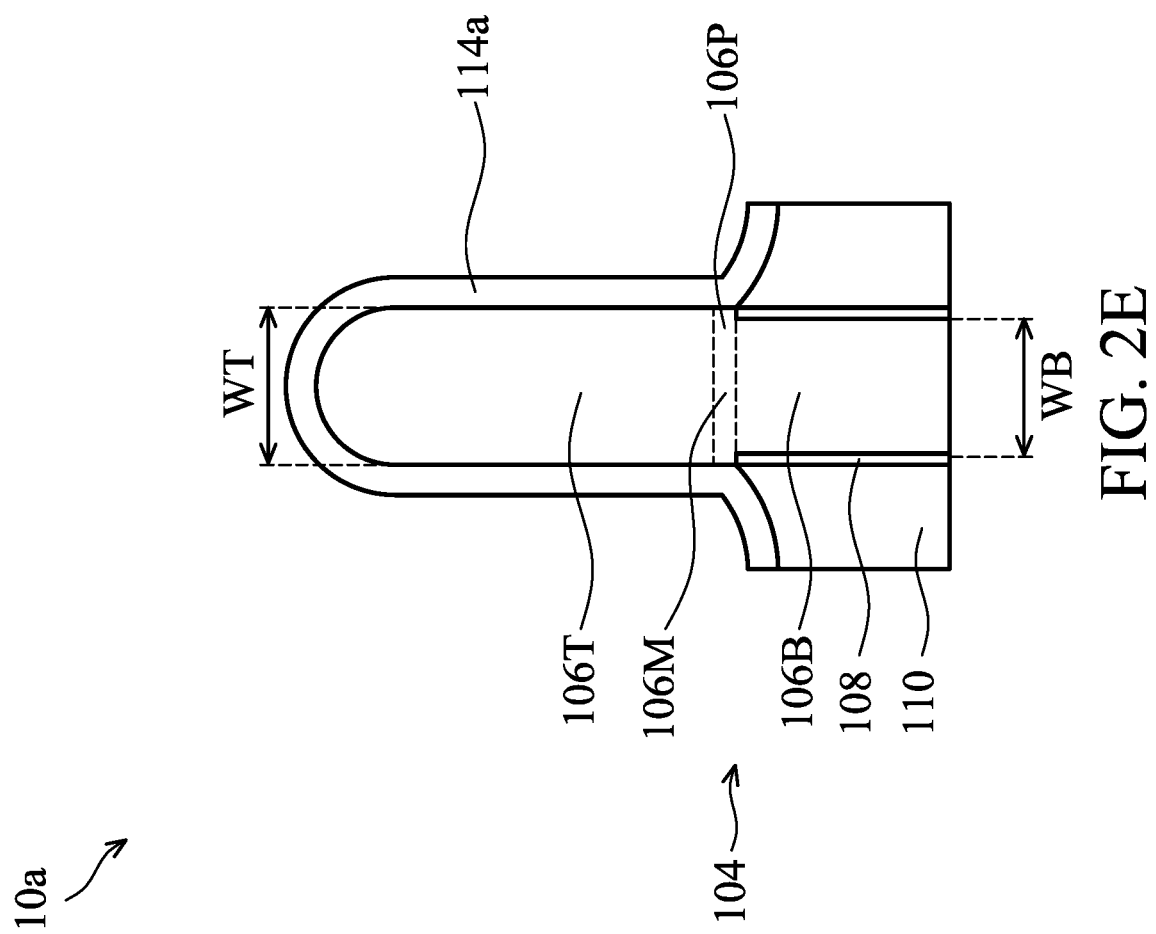

In some embodiments, since the cap layer 112 and the fin structure 106 are made of the same material, the cap layer 112 and the fin structure 106 is be indistinguishable. Therefore, as shown in FIG. 2E, after forming the gate dielectric layer 114a, the fin structure 106 includes a bottom portion 106B, a middle portion 106M, and top portion 106T. In some embodiments, the bottom portion 106B and the middle portion 106M of the fin structure 106 are in the doped region 104 and are doped with a first dopant concentration. In some embodiments, the top portion 106T of the fin structure 106 is doped with a second dopant concentration or undoped. In some embodiments, the first dopant concentration is higher than the second dopant concentration.

It should be noted that, there is no obvious interface between the bottom portion 106B, the middle portion 106M, and the top portion 106T of the fin structure 106, and therefore the interface between them is shown by a dashed line.

As shown in FIG. 2E, compared to the bottom portion 106B of the fin structure 106, the middle portion 106M of the fin structure 106 laterally protrudes from a sidewall of the middle portion 106M of the fin structure 106. In some embodiments, the middle portion 106M has a protruding portion 106P of the fin structure 106 laterally extending over the liner layer 108. In some embodiments, the protruding portion 106P of the fin structure 106 is in direct contact with the top surface of the liner layer 108.

As shown in FIG. 2E, the top portion 106T of the fin structure 106 and the middle portion 106M of the fin structure 106 has a width of WT, and the bottom portion 106B of the fin structure 106 has a width of WB. In some embodiments, since the middle portion 106M of the fin structure laterally protrudes over the liner layer 108, the width WT of the top portion 106T and the middle portion 106M of the fin structure 106 is wider than the width WB of the bottom portion 106B of the fin structure 106.

As shown in FIGS. 2D and 2E, after forming the gate dielectric layer 114a, the cap layer 112 remains over the fin structure 106. Therefore, the fin structure 106 may not be damaged during the formation of the gate dielectric layer 114a, and mechanical integrity issues or carrier mobility degradation may be prevented.

Next, a dummy gate layer may be conformally formed over the gate dielectric layer 114a (not shown). The dummy gate layer may be made of polysilicon. The dummy gate layer may be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, an etching process may be performed on the dummy gate layer to form a dummy gate structure by using a patterned photoresist layer as a mask (not shown). The dummy oxide layer may also be partially removed in the etching process. The etching process may be a dry etching process or a wet etching process. In some embodiments, the dummy gate layer and the dummy oxide layer are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 106 may be exposed on the opposite sides of the dummy gate structure.

Figures 1, 2F:
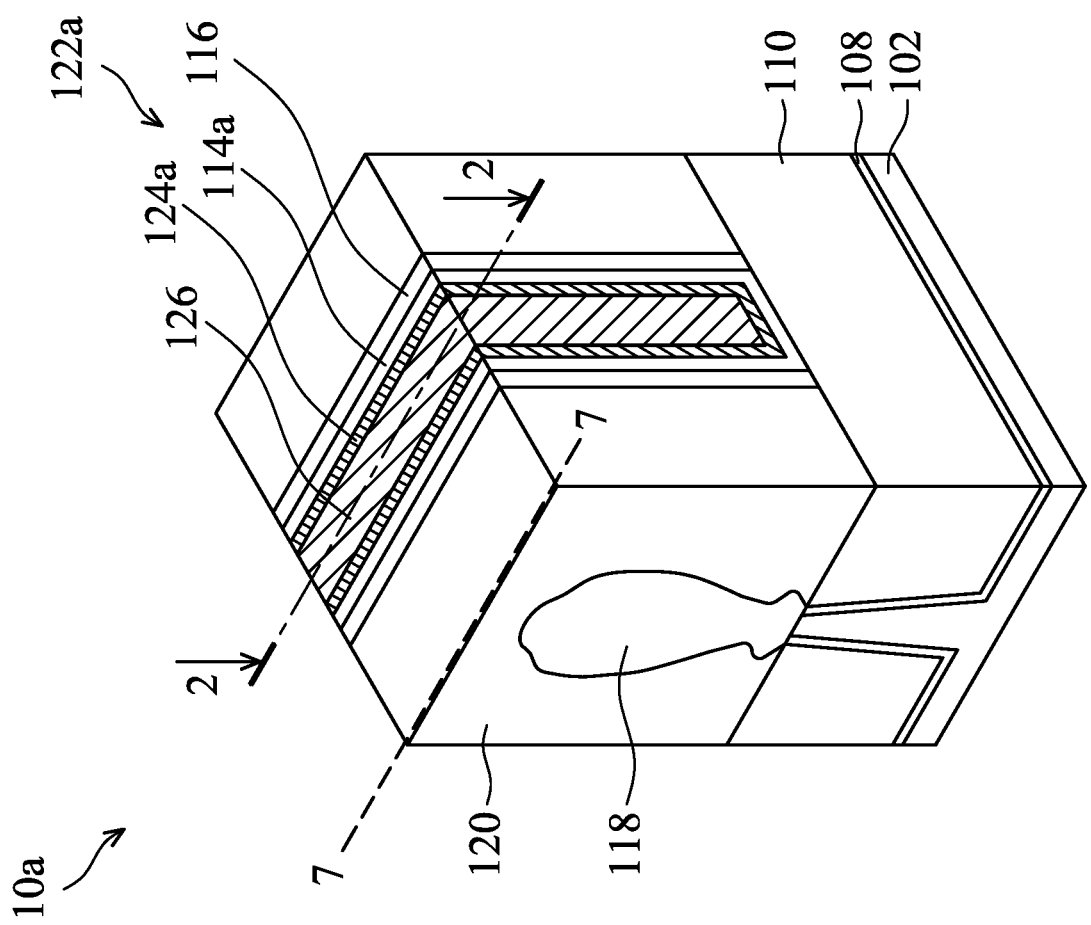

Next, as shown in FIG. 2F-1 in accordance with some embodiments, a pair of spacers 116 are formed on opposite sidewalls of the dummy gate structure. The spacers 116 may be made of silicon oxide, silicon nitride, silicon oxynitride, and/or dielectric materials. The spacers 116 may be formed by a chemical vapor deposition (CVD) process, a spin-on-glass process, or another applicable process.

Afterwards, the top portion of the fin structure 106 exposed on the opposite sides of the dummy gate structure is removed to form a recess by an etching process (not shown). The etching process may include a dry etching process or a wet etching process. In some embodiments, the fin structure 106 is etched by a dry etching process. The dry etching process may include using a fluorine-based etchant gas, such as $SF_6$, $C_xF_y$ (where x and y may be positive integers), $NF_3$, or a combination thereof.

Next, as shown in FIG. 2F-1 in accordance with some embodiments, a source/drain (S/D) structure 118 are formed in the recess over the fin structure 106. A strained material may be grown in the recess by an epitaxial (epi) process to form the S/D structure 118. In addition, the lattice constant of the strained material may be different from the lattice constant of the substrate 102. The S/D structure 118 may include Ge, SiGe, InAs, InGaAs, InSb, GaAs, GaSb, InAlP, InP, SiC, SiP, other applicable materials, or a combination thereof. The S/D structure 118 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable method.

After the S/D structure 118 is formed, as shown in FIG. 2F-1 in accordance with some embodiments, an inter-layer dielectric (ILD) structure 120 is formed to cover the S/D structure 118. The inter-layer dielectric structure 120 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric structure 120 may be formed by chemical vapor deposition (CVD), spin-on coating, or other applicable processes.

Afterwards, a planarizing process is performed on the ILD structure 120 until the top surface of the dummy gate structure is exposed (not shown). After the planarizing process, the top surface of the dummy gate structure may be substantially level with the top surfaces of the spacers 116 and the ILD structure 120. The planarizing process may include a grinding process, a chemical mechanical polishing (CMP) process, an etching process, another applicable process, or a combination thereof.

Next, the dummy gate structure is removed to form a trench between the spacers 116 (not shown). The fin structure 106 may be exposed from the trench. The dummy gate structure may be removed by an etching process, such as a dry etching process or a wet etching process.

Figures 2, 2F:
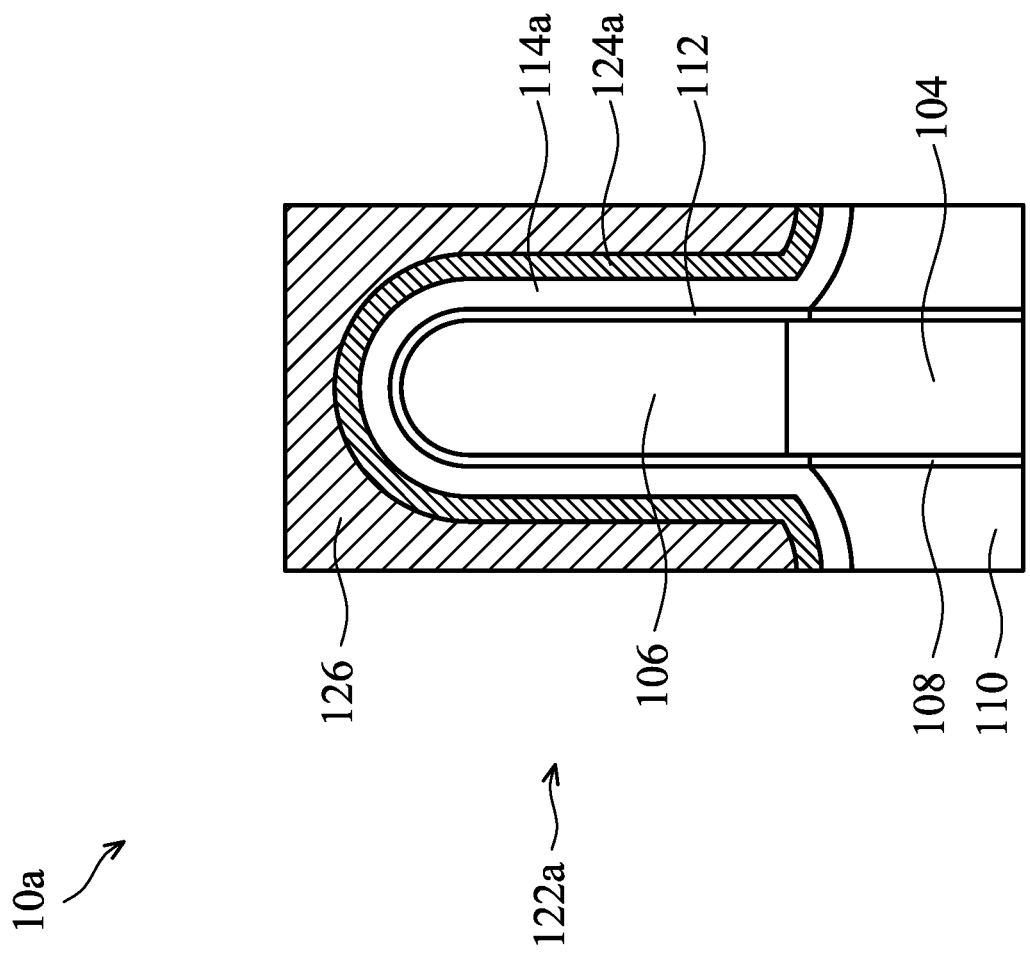

FIG. 2F-2 shows a cross-sectional representation taken along line 2-2 in FIG. 2F-1. Next, as shown in FIGS. 2F-1 and 2F-2 in accordance with some embodiments, a gate structure 122a is formed over the gate dielectric layer 114a across the fin structure 106. As shown in FIGS. 2F-1 and 2F-2, the gate structure 122a includes a gate dielectric layer 114a, a work function layer 124a, and a gate electrode layer 126.

As shown in FIGS. 2F-1 and 2F-2, the work function layer 124a is formed over the gate dielectric layer 114a. The work function layer 124a may provide the desired work function for transistors to enhance device performance including improved threshold voltage. The work function layer 124a may be made of metal materials, and the metal materials may include N-work-function metal or P-work-function metal. For N-type transistors, N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. For P-type transistors, the P-work-function metal may include titanium nitride (TiN), tungsten nitride (WN), tantalum nitride (TaN), ruthenium (Ru) or a combination thereof.

As shown in FIGS. 2F-1 and 2F-2, the gate electrode layer 126 is formed over the work function layer 124a. The metal gate electrode layer 126 may be made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. The gate electrode layer 126 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Figures 1, 2G:
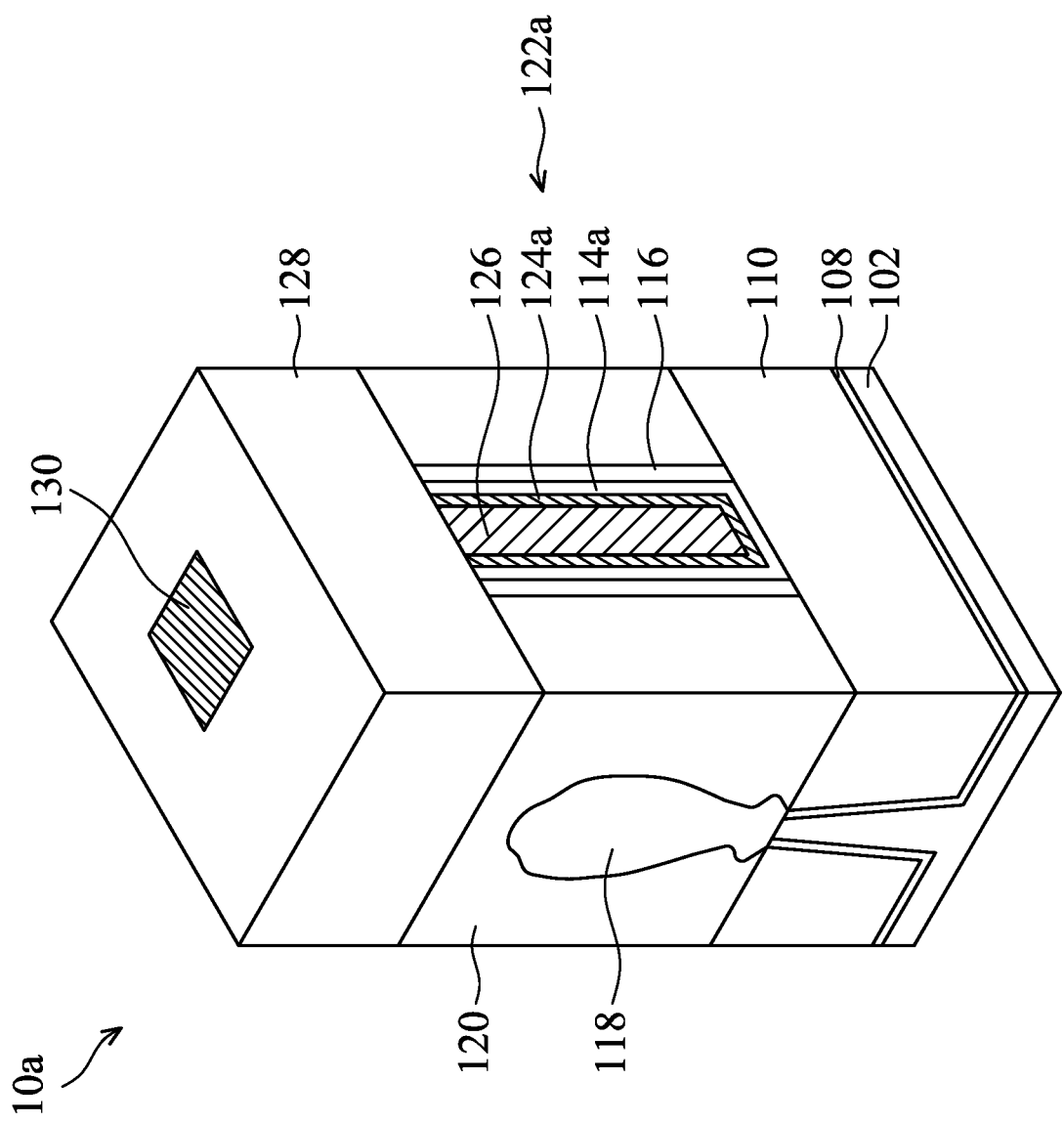
Figures 2, 2G:
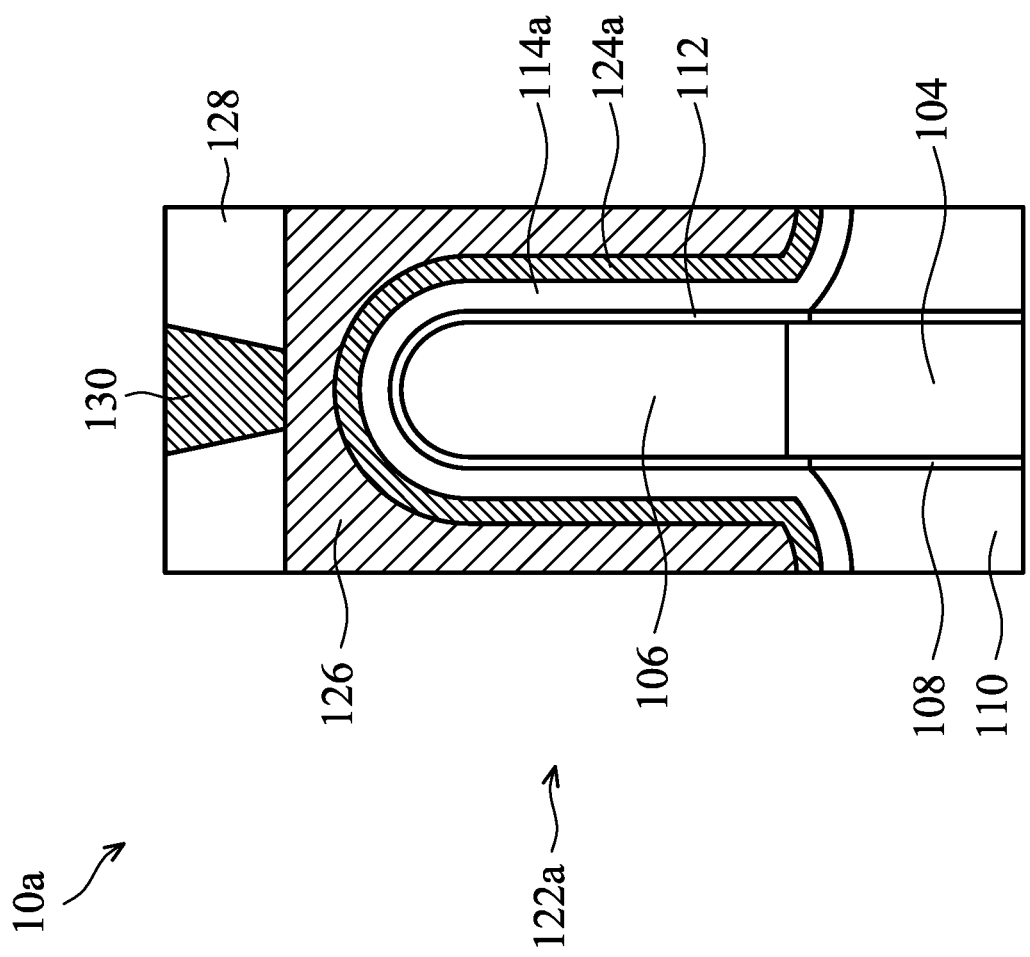

Next, a second ILD structure 128 is blanketly formed over the first ILD structure 120 and the gate structure 122a, as shown in FIGS. 2G-1 and 2G-2 in accordance with some embodiments. The processes for forming the second ILD structure 128 may be the same as, or similar to, those used to form the first ILD structure 120. For the purpose of brevity, the descriptions of these processes are not repeated herein.

Next, a portion of the second ILD structure 128 over the gate structure 122a may be removed, and a trench may be formed over gate structure 122a (not shown). The trench may be formed by an etching process such as a dry etching process or a wet etching process. The gate structure 122a may be exposed from the trenches.

Afterwards, a contact structure 130 is filled into the trench, as shown in FIGS. 2G-1 and 2G-2 in accordance with some embodiments. The contact structure 130 may be made of metal materials (e.g., W, Al, or Cu), metal alloys, poly-Si, other applicable conductive materials, or a combination thereof. The contact structure 130 can be formed by using a chemical vapor deposition process (CVD), a physical vapor deposition process (PVD, e.g., evaporation or sputter), an atomic layer deposition process (ALD), an electroplating process, another suitable process, or a combination thereof to deposit the conductive materials of the first contact structure, and then optionally performing a chemical mechanical polishing (CMP) process or an etching back process to remove excess conductive materials. In some embodiments, the contact structure 130 electrically connected to the gate structure 122a underneath.

By selectively growing a cap layer 112 over the fin structure 106 before forming the gate dielectric layer 114a, the fin structure 106 may not be consumed during the formation of the gate dielectric layer 114a, and mechanical integrity issues or carrier mobility degradation may be prevented.

Many variations and/or modifications may be made to the embodiments of the disclosure. FIGS. 3A-3G are cross-sectional representations of various stages of forming a FinFET device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3B in accordance with some embodiments, the fin structure 106 is trimmed after forming the fin structure 106.

Figure 3A:
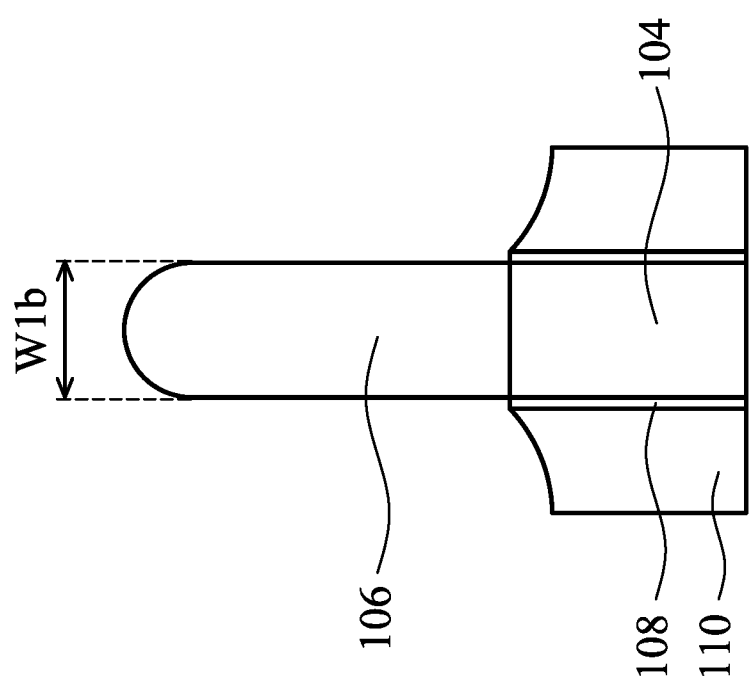
Figure 3B:
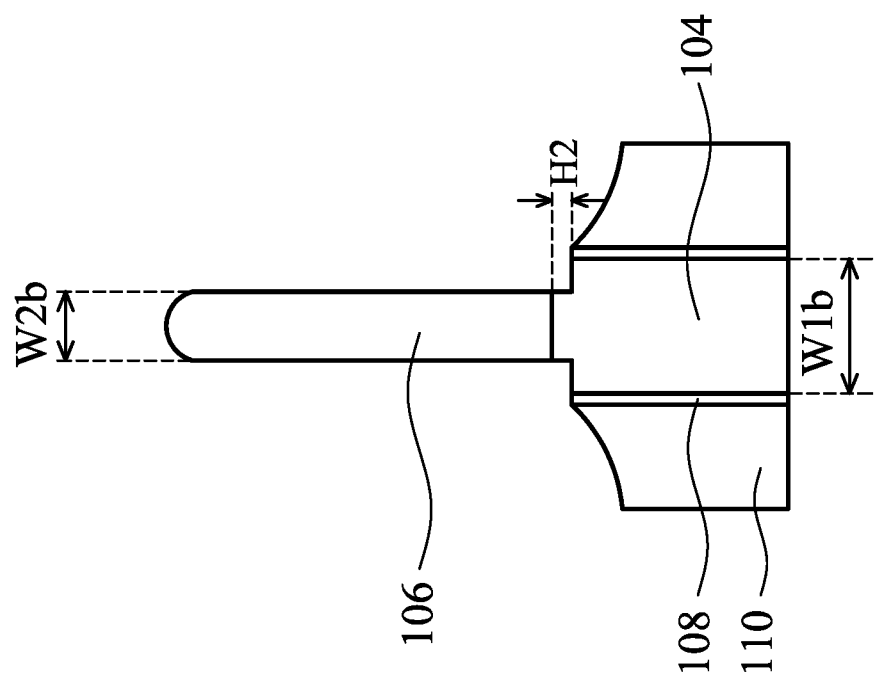

In some embodiments as shown in FIGS. 3A and 3B, the top portion of the fin structure 106 has a fin width W1b after forming the fin structure 106 and a fin width W2b of the fin structure 106 after trimming the fin structure 106. The fin width W2b of the top portion of the fin structure 106 after trimming the fin structure 106 is narrower than the fin width W1b before trimming the fin structure 106. As shown in FIG. 3B, the fin width W1b of the bottom portion of the fin structure 106 remains after trimming the fin structure 106. In some embodiments, the fin width W1b of the bottom portion of the fin structure 106 is wider than the fin width W2b of the top portion of the fin structure 106 after trimming the fin structure 106.

In some embodiments as shown in FIG. 3B, the liner layer 108 and the isolation structure 110 are vertically recessed by a height H2. In some embodiments, the recess height H2 is in a range of about 3 Å to about 30 Å.

The trimming process may remove the by-product of the process forming the fin structure 106. The trimming process may also enhance the device performance. The trimming may include a wet etching process or a dry etching process. The wet cleaning process may use wet etching etchant such as hydrofluoric acid (HF). The dry cleaning process may also include dry cleaning using etchant gas such as $SiF_6$ with plasma, combination of plasma treated-$NF_3$/$NH_3$ or plasma treated-$NF_3$ and $NH_3$, or HF/$NH_3$ mixing gas.

Figure 3C:
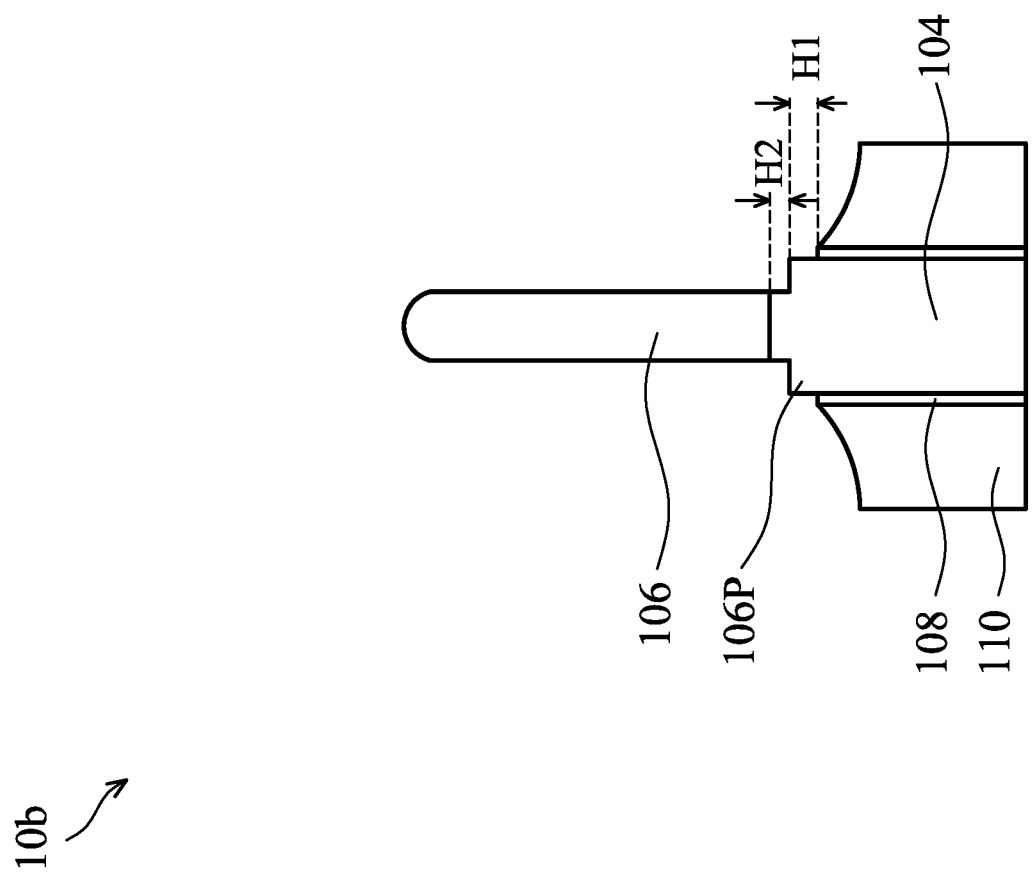

Next, a cleaning process is performed over the fin structure 106 as shown in FIG. 3C in accordance with some embodiments. The cleaning process may be the same as, or similar to, the process performed in the embodiment as shown in FIG. 2B. For the purpose of brevity, the descriptions of these processes are not repeated herein.

As shown in FIG. 3C, the cleaning process further recess the liner layer 108 and the isolation structure 110 by a height H1. Therefore, the fin structure 106 has a protruding portion 106P adjacent to the top surface of the liner layer 108 and the isolation structure 110.

Figure 3D:
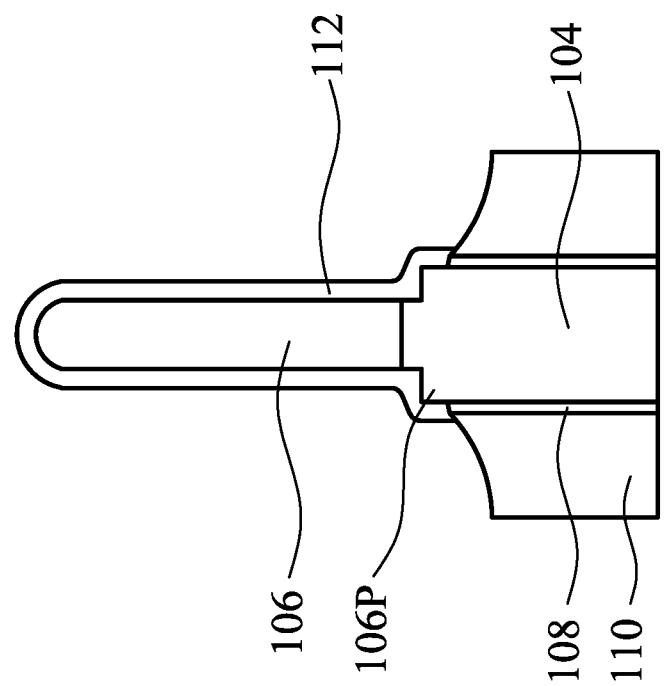

Next, as shown in FIG. 3D, a cap layer 112 is conformally grown over the fin structure 106. In some embodiments, the cap layer 112 covers the top surface and the sidewall of the protruding portion 106P of the fin structure 106 and the top surface of the liner layer 108. As shown in FIG. 3D, the cap layer 112 further laterally extend from the sidewall of the protruding portion 106P of the fin structure 106. The material and the process of growing the cap layer 112 may be the same as, or similar to, those in the embodiment as shown in FIG. 2C. For the purpose of brevity, the descriptions of these materials and the processes are not repeated herein.

Afterwards, as shown in FIG. 3E, a gate dielectric layer 114a is formed over the cap layer 112, the liner layer 108, and the isolation structure 110 as shown in FIG. 3E in accordance with some embodiments. The material and the process of growing the cap layer 112 may be the same as, or similar to, the process performed in the embodiment as shown in FIG. 2D. For the purpose of brevity, the descriptions of the materials and the processes are not repeated herein. Since the fin structure 106 is trimmed and the liner layer 108 and the isolation structure 110 is recess, the doped region 104 in the fin structure 106 has a narrower top portion 104T as shown in FIG. 3E.

In some embodiments, since the cap layer 112 and the fin structure 106 are made of the same material, the cap layer 112 and the fin structure 106 are indistinguishable. Therefore, as shown in FIG. 3F, after forming the gate dielectric layer 114a, the fin structure 106 includes a bottom portion 106B, a middle portion 106M including the protruding portion 106P, and the top portion 106T.

Figure 3F:
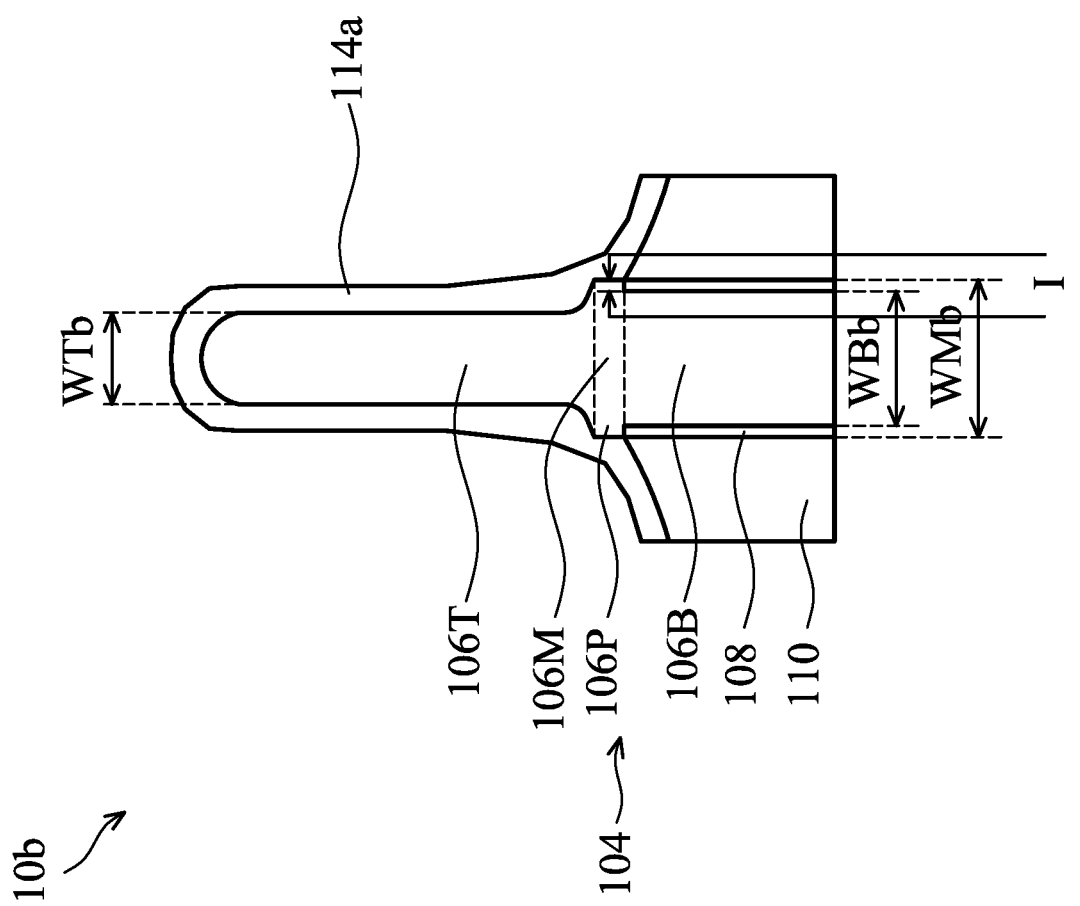

As shown in FIG. 3F, compared to the bottom portion 106B of the fin structure 106, the middle portion 106B including the protruding portion 106P of the fin structure 106 laterally protrudes from a sidewall of the middle portion 106M of the fin structure 106. As shown in FIG. 3F, the protrusion I is the lateral distance between a sidewall of the middle portion 106M of the fin structure 106 and a sidewall of the bottom portion 106B of the fin structure. In some embodiments as shown in FIG. 3F, the protrusion I is in a range from about 2 Å to about 30 Å. In some embodiments, the protrusion I is in a range from about 2 Å to about 20 Å. In some embodiments, the protrusion I is in a range from about 2 Å to about 8 Å. If the protrusion I is too great, the fin structure 106 may be too wide, and the device performance may degrade. If the protrusion I is too less, the cap layer 112 may be too thin, and the fin structure 106 may be consumed during the formation of the gate dielectric layer 114a.

As shown in FIG. 3F, the top portion 106T of the fin structure 106 has a width of WTb, the middle portion 106M of the fin structure 106 has a width of WMb, and the bottom portion 106B of the fin structure 106 has a width of WBb. In some embodiments, since the middle portion 106M of the fin structure laterally protrudes over the liner layer 108 and the fin structure 106 is trimmed, the width WMb of the middle portion 106M of the fin structure 106 is wider than the width WTb of the top portion 106T of the fin structure 106. In addition, as shown in FIG. 3F, the width WMb of the middle portion 106M of the fin structure 106 is wider than the width WBb of the bottom portion 106B of the fin structure 106.

Figure 3G:
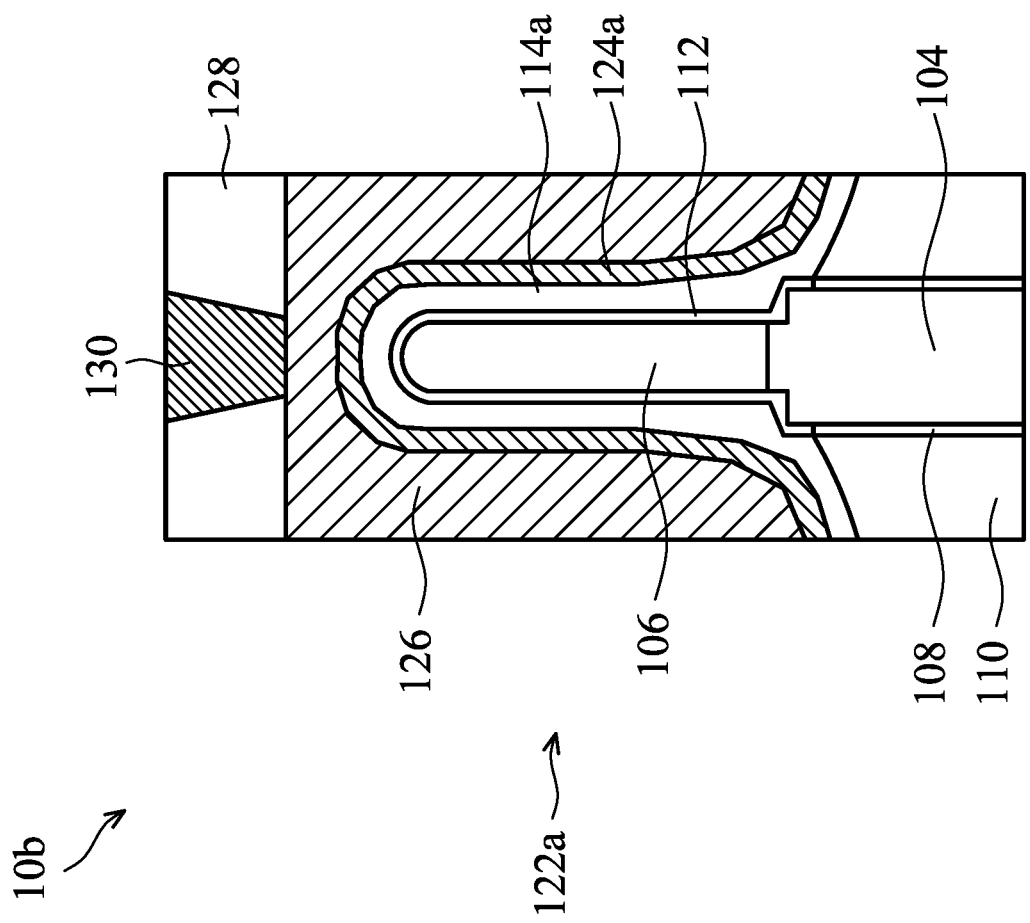

Next, as shown in FIG. 3G, a gate structure 122a is formed over the gate dielectric layer 114a, and a second ILD structure 128 is formed over the gate structure 122a. Moreover, a contact structure 130 is formed in the second ILD structure 128 electrically connected to the gate structure 122a. The material and the process of forming the gate structure 122a, the second ILD structure 128, and the contact structure 130 may be the same as, or similar to, the process performed in the embodiment as shown in FIGS. 2F-1, 2F-2, 2G-1, and 2G-2. For the purpose of brevity, the descriptions of these processes are not repeated herein.

By selectively growing a cap layer 112 over the fin structure 106 before forming the gate dielectric layer 114a, the fin structure 106 may not be consumed during the formation of the gate dielectric layer 114a, and mechanical integrity issues or carrier mobility degradation may be prevented. In addition, trimming the fin structure 106 after forming the fin structure 106 may remove the by-product of previous process. Moreover, the device performance may be also enhanced.

Figure 4B:
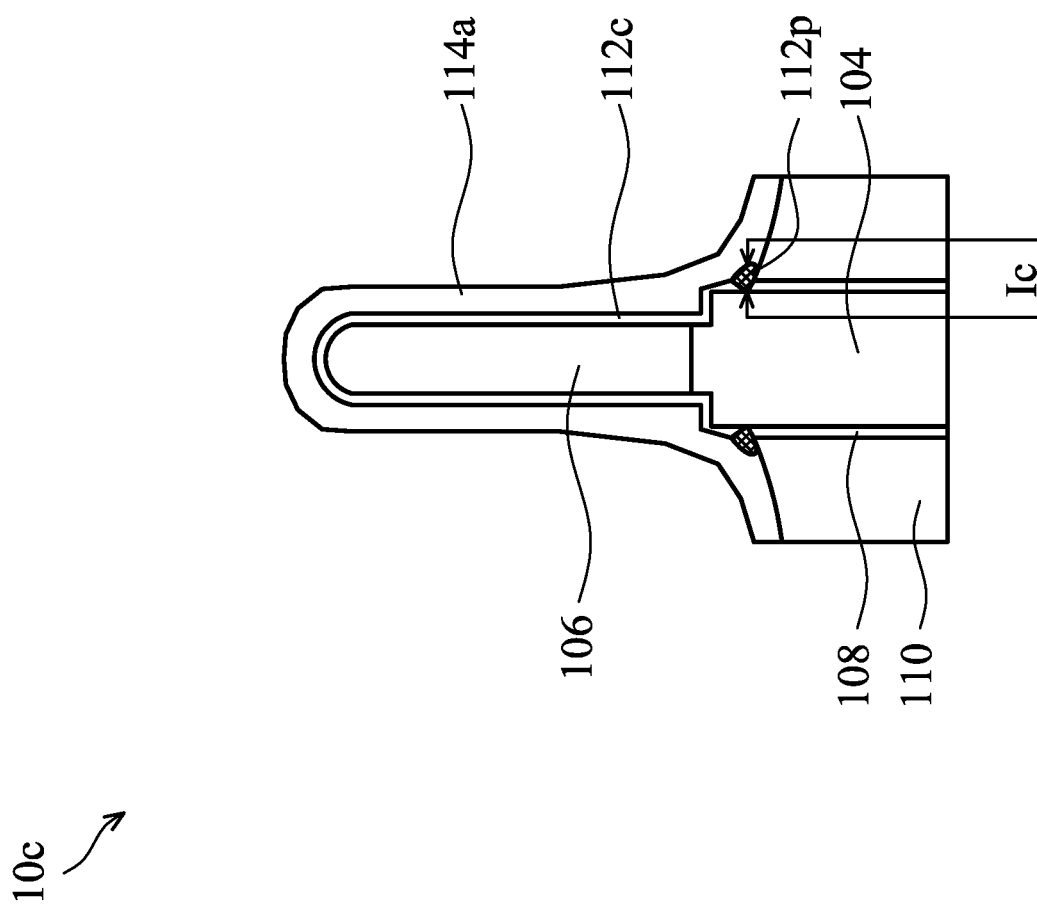
Figure 4C:
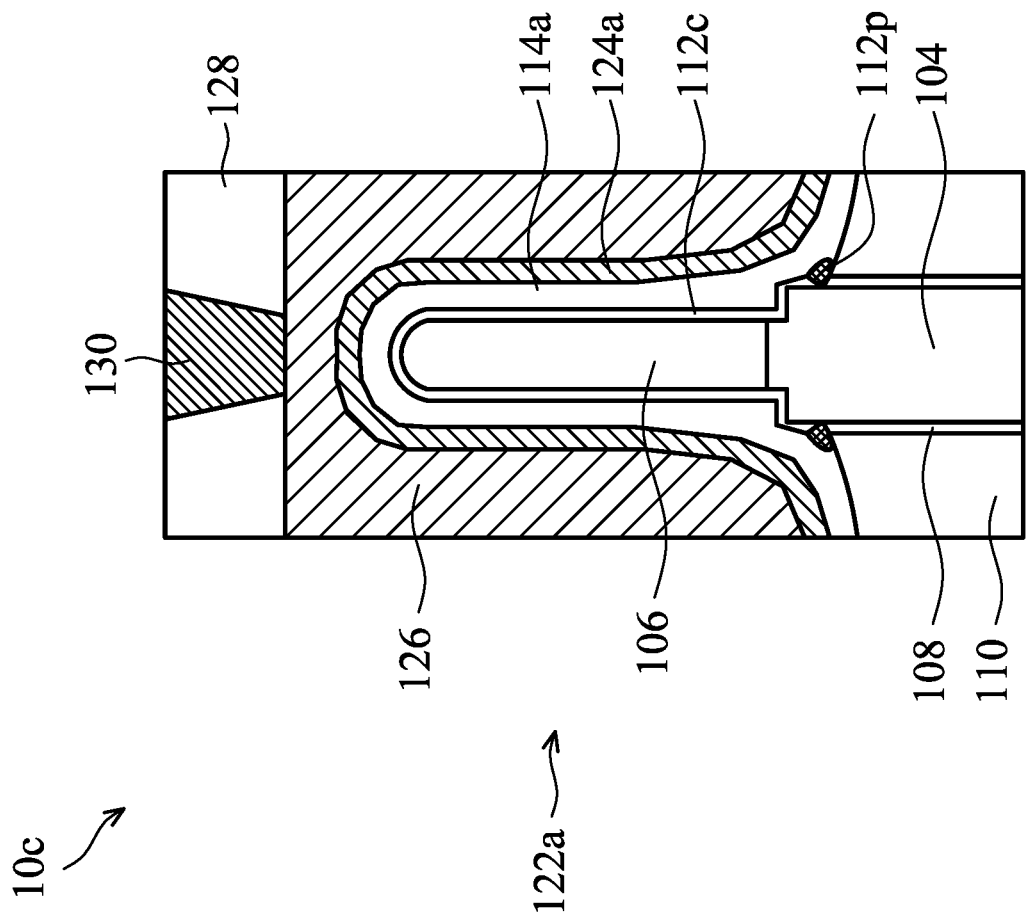

Many variations and/or modifications may be made to the embodiments of the disclosure. FIGS. 4A-4C are cross-sectional representations of various stages of forming a FinFET device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A, the cap layer 112 is also grown over the isolation structure 110.

In some embodiments, the cap layer 112 is non-selectively grown over the fin structure 106, the liner layer 108, and the isolation structure 110. In some embodiments, the cap layer 112 formed over the liner layer 108 and the isolation structure 110 is an amorphous portion 112a, and the cap layer 112 formed over the fin structure 106 is a crystallized portion 112c. As shown in FIG. 4A, the amorphous portion 112a of the cap layer 112 is in direct contact with the crystallized portion 112c of the cap layer 112 over the fin structure 106. In some embodiments, the amorphous portion 112a of the cap layer 112 is also in direct contact with the liner layer 108 and the isolation structure 106.

In some embodiments, if the cap layer 112 is grown by CVD or PECVD, the cap layer 112 may be grown under a temperature above about 700° C. and under a pressure above 760 Torr. In some embodiments, if the cap layer 112 is grown by ALD or PEALD, the cap layer 112 may be grown under a temperature above about 600° C. and under a pressure above 700 mTorr. In some embodiments, the precursor of the deposition process of the cap layer 112 includes high order silane such as $Si_2H_6$ or $Si_3H_8$. Under these processing conditions, the cap layer 112 may be also grown over the liner layer 108 and the isolation structure 110. Since the isolation structure 110 may be a dielectric material, the cap layer 112 grown over the isolation structure 110 may be amorphous. Since the native oxide layer formed over the cap layer 112 may be removed during the cleaning process, the cap layer 112 grown over the fin structure 106 may be crystallized.

Next, as shown in FIG. 4B, the gate dielectric layer 114a is formed over the cap layer 106, including the amorphous portion 112a over the isolation structure 110 and the crystallized portion 112c over the fin structure 106. During formation of the gate dielectric layer 114a, the amorphous portion 112a of the cap layer 112 may be consumed or oxidized. The remaining amorphous portion 112a of the cap layer 112 after forming of the gate dielectric layer 114a may be re-crystallized to poly-crystalline due to thermal treatment of the formation of the gate dielectric layer 114a. Therefore, a poly-crystalline portion 112p is formed covering the liner layer 108 and partially covering the isolation structure 110. In some embodiments, the poly-crystalline portion 112p of the cap layer 112 is made of poly-crystalline silicon.

As shown in FIG. 4B, compared to the bottom portion of the fin structure 106, the poly-crystalline portion 112p of the cap layer 112 laterally protrudes from a sidewall of the fin structure 106 by a protrusion Ic. In some embodiments as shown in FIG. 4B, the protrusion Ic of the protruding portion 112p is in a range from about 2 Å to about 30 Å. In some embodiments, the protrusion Ic of the protruding portion 112p is in a range from about 2 Å to about 20 Å. In some embodiments, the protrusion Ic of the protruding portion 112p is in a range from about 2 Å to about 8 Å. If the protrusion Ic is too great, the fin structure 106 may be too wide, and the device performance may degrade. If the protrusion Ic is too less, the cap layer 112 may be too thin, and the fin structure 106 may be consumed during the formation of the gate dielectric layer 114a.

Next, as shown in FIG. 4C, a gate structure 122a is formed over the gate dielectric layer 114a, and a second ILD structure 128 is formed over the gate structure 122a. Moreover, a contact structure 130 is formed in the second ILD structure 128. The material and the process of forming the gate structure 122a, the second ILD structure 128, and the contact structure 130 may be the same as, or similar to, the process performed in the embodiment as shown in FIGS. 2F-1, 2F-2, 2G-1, and 2G-2. For the purpose of brevity, the descriptions of these processes are not repeated herein.

By growing a cap layer 112 over the fin structure 106 before forming the gate dielectric layer 114a, the fin structure 106 may not be consumed during the formation of the gate dielectric layer 114a, and mechanical integrity issues or carrier mobility degradation may be prevented. Trimming the fin structure 106 is after forming the fin structure 106 may remove the by-product of previous process. The device performance may be also enhanced. In addition, since the cap layer 112 is non-selectively grown over the fin structure 106, the liner layer 108, and the isolation structure 110, the cap layer 112 may has a poly-crystalline protruding portion 112p laterally extending over the liner layer 108, which may help to identify the cap layer process with less fin structure 106 damage.

Many variations and/or modifications may be made to the embodiments of the disclosure. FIGS. 5A-5F are cross-sectional representations of various stages of forming a FinFET device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5B, after trimming the fin structure 106, the fin structure 106 adjacent to the top surface of the isolation structure 110 has a curved sidewall 106S.

In some embodiments as shown in FIG. 5B, the liner layer 108 and the isolation structure 110 are recessed by a height H2. As shown in FIG. 5B, a portion of the doped region 104 of the fin structure 106 is exposed, which has a curved sidewall 106S.

Figure 5A:
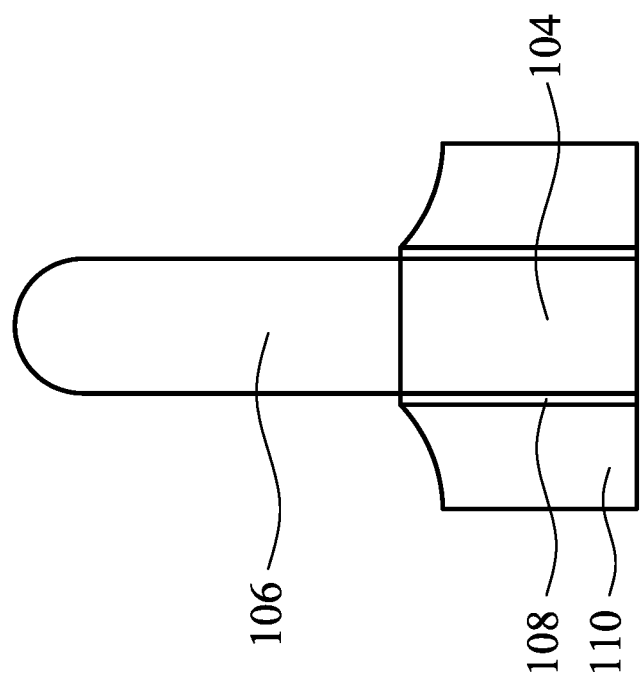
Figure 5C:
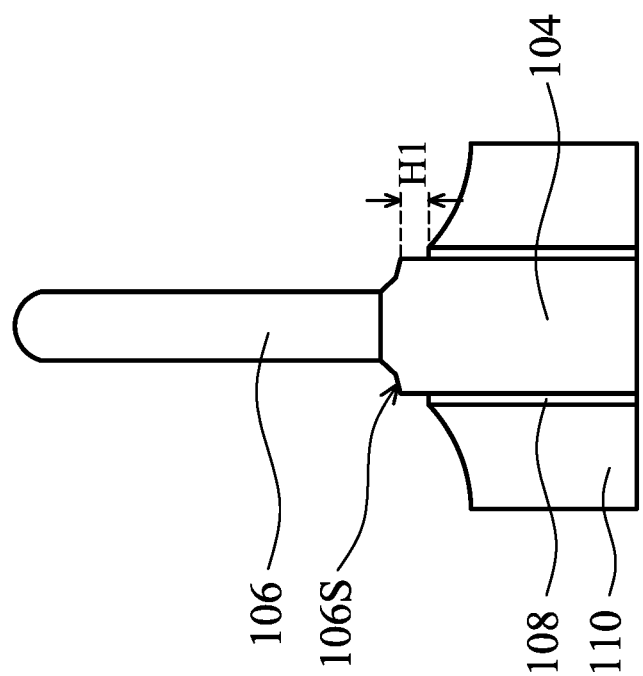

Next, as shown in FIG. 5C, after the cleaning process, the liner layer 108 and the isolation structure 110 are further recessed by a height H1. As shown in FIG. 5C, a portion of the doped region 104 of the fin structure 106 is further exposed, which has a straight sidewall and a curved top surface 106S.

Figure 5D:
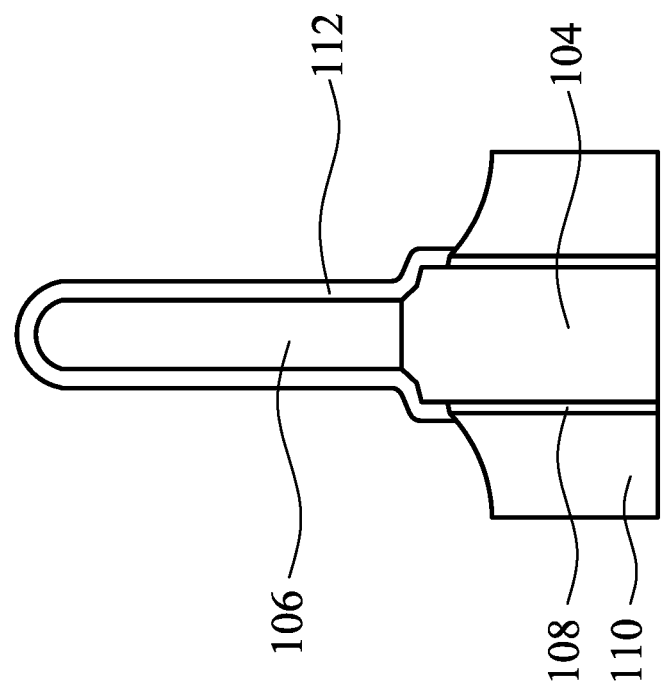

Afterwards, as shown in FIGS. 5D and 5E, the cap layer 112 is selectively grown over the fin structure 106 and the gate dielectric layer 114a is deposited over the cap layer 112. As shown in FIG. 5E, the fin structure 106 has a protruding portion 106P at the middle of the fin structure 106. In some embodiments, the protruding portion 106P at the middle portion of the fin structure 106 which has a curved top surface 106S and a straight sidewall is above the top surface of the liner layer 108.

Figure 5F:
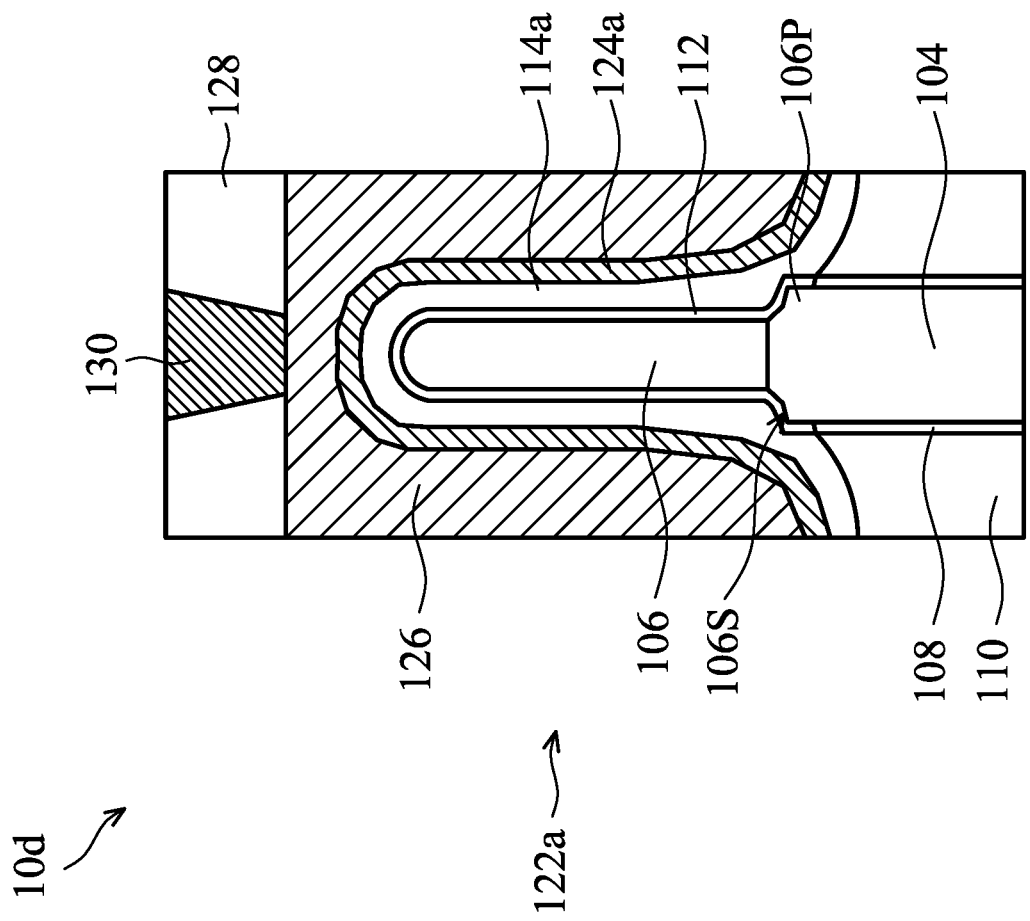

Next, as shown in FIG. 5F, a gate structure 122a is formed over the gate dielectric layer 114a, and a second ILD structure 128 is formed over the gate structure 122a. Moreover, a contact structure 130 is formed in the second ILD structure 128. The material and the process of forming the gate structure 122a, the second ILD structure 128, and the contact structure 130 may be the same as, or similar to, the process performed in the embodiment as shown in FIGS. 2F-1, 2F-2, 2G-1, and 2G-2. For the purpose of brevity, the descriptions of these processes are not repeated herein.

By selectively growing a silicon cap layer 112 over the fin structure 106 before forming the gate dielectric layer 114a, the fin structure 106 may not be consumed during the formation of the gate dielectric layer 114a, and mechanical integrity issues or carrier mobility degradation may be prevented. In addition, trimming the fin structure 106 after forming the fin structure 106 may remove the by-product of previous process. Moreover, the device performance may be also enhanced. Trimming the fin structure 106 may cause a protruding portion 106P of the fin structure 106 with a curved top surface 106S, which is recognizable in the final structure.

Figure 6A:
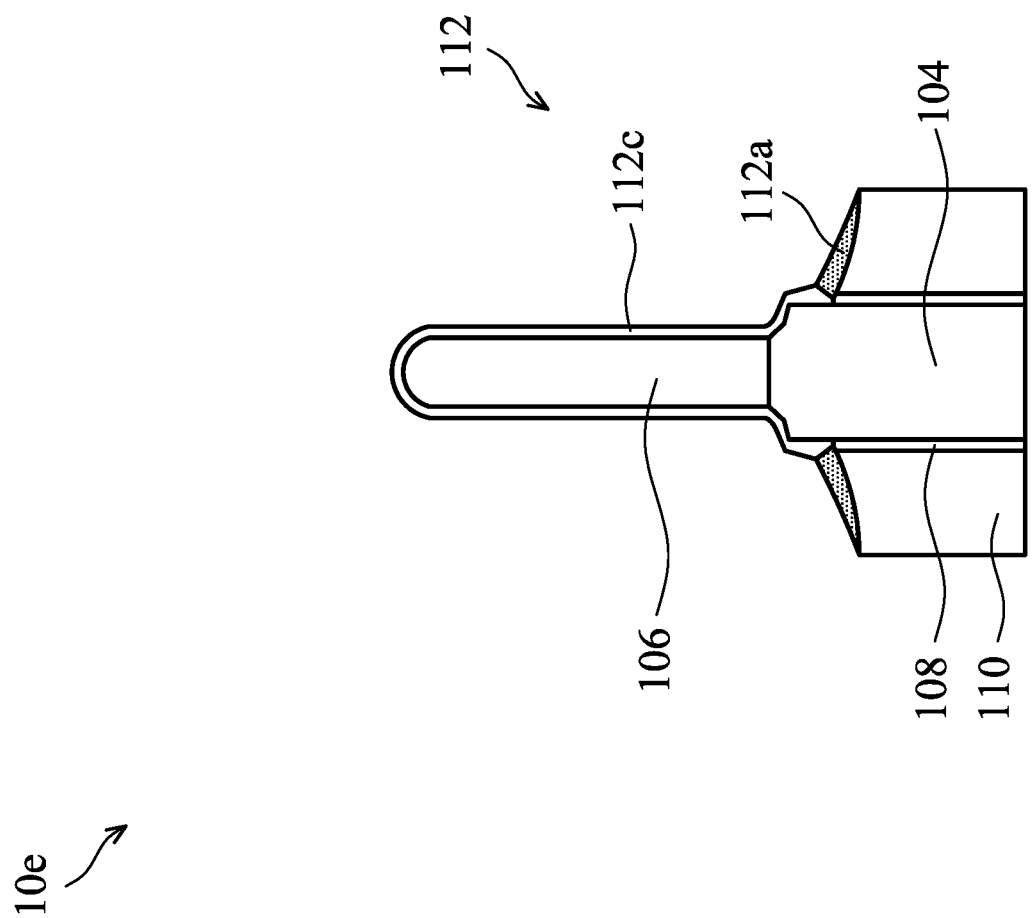
Figure 6B:
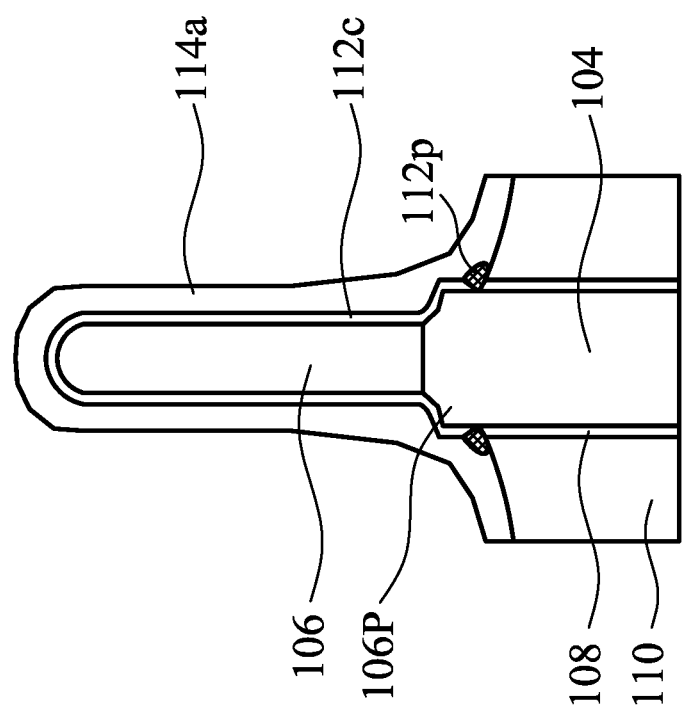

Many variations and/or modifications may be made to the embodiments of the disclosure. FIGS. 6A-6C are cross-sectional representations of various stages of forming a FinFET device structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A, after trimming the fin structure 106, the fin structure 106 adjacent to the top surface of the isolation structure 110 has a curved sidewall 106S, and the cap layer 112 is also grown over the isolation structure 110.

In some embodiments as shown in FIGS. 6A and 6B, the cap layer 112 includes an amorphous portion 112a covering the liner layer 108 and the isolation structure 110. The cap layer 112 also includes a crystallized portion 112c covering the fin structure 106. After forming the gate dielectric layer 114a, the amorphous portion 112a of the cap layer 112 may re-crystallized to a poly-crystalline portion 112p covering the liner layer 108 and the isolation structure 110. As shown in FIG. 6B, the crystallized portion 112c of the cap layer 112 covers the protruding portion 106P of the fin structure 106 (i.e., the top portion of the doped region 104 of the fin structure 106), which has a curved top surface at the corner.

Next, as shown in FIG. 6C, a gate structure 122a is formed over the gate dielectric layer 114a, and a second ILD structure 128 is formed over the gate structure 122a. Moreover, a contact structure 130 is formed in the second ILD structure 128. The material and the process of forming the gate structure 122a, the second ILD structure 128, and the contact structure 130 may be the same as, or similar to, the process performed in the embodiment as shown in FIGS. 2F-1, 2F-2, 2G-1, and 2G-2. For the purpose of brevity, the descriptions of these processes are not repeated herein.

By growing a cap layer 112 over the fin structure 106 before forming the gate dielectric layer 114a, the fin structure 106 may not be consumed during the formation of the gate dielectric layer 114a, and mechanical integrity issues or carrier mobility degradation may be prevented. Trimming the fin structure 106 is after forming the fin structure 106 may remove the by-product of previous process. The device performance may be also enhanced. In addition, since the cap layer 112 is non-selectively grown over the fin structure 106, the liner layer 108, and the isolation structure 110, the cap layer 112 may has a poly-crystalline protruding portion 112p laterally extending over the liner layer 108, which may help to identify the cap layer process with less fin structure 106 damage. Trimming the fin structure 106 may cause a protruding portion 106P with a curved top surface 106S, which is recognizable in the final structure.

Figure 7:
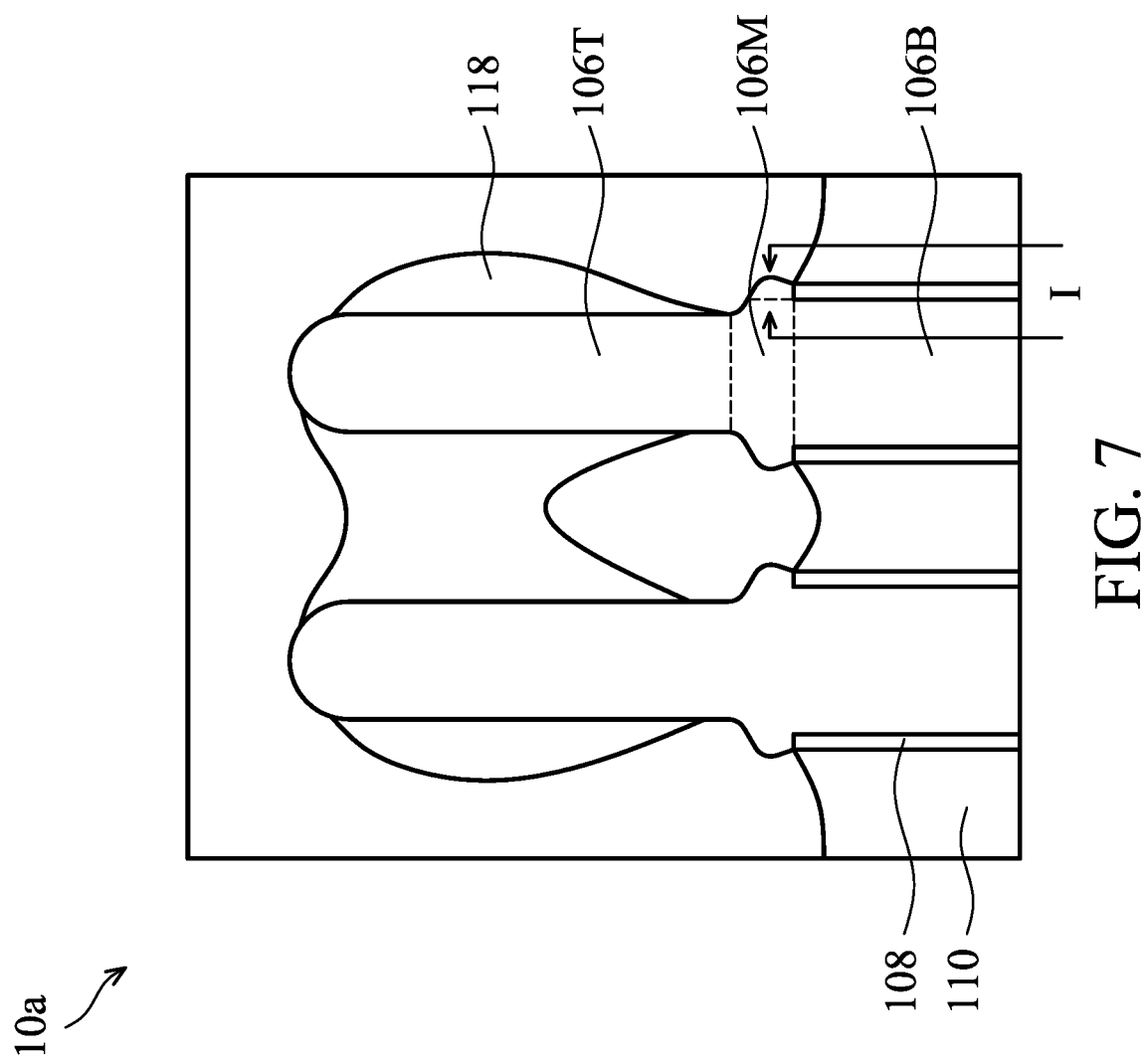
FIG. 7 is a cross-sectional representation of a FinFET device structure, in accordance with some embodiments of the disclosure.

FIG. 7 is a cross-sectional representation of the FinFET device structure 10a, in accordance with some embodiments of the disclosure. FIG. 7 shows a cross-sectional representation taken along line 7-7 in FIG. 2F-1.

In some embodiments as shown in FIG. 7, After growing the cap layer 112, since the cap layer 112 and the fin structure 106 may be indistinguishable since both of them are crystalline in nature, the middle portion 106M of the fin structure 106 laterally protrudes by protrusion I. If the protrusion I is too great, device performance may degrade. If the protrusion I is too less, there may be etching loss in subsequently process.

As shown in FIG. 7, the middle portion 106M of the fin structure 106 covers the liner layer 108. Afterwards, the S/D structure 118 may be formed over the middle portion 106M of the fin structure 106 (i.e. the cap layer 112) adjacent to the isolation structure 110.

By growing a cap layer 112 over the fin structure 106 before forming the gate dielectric layer 114a, the fin structure 106 may not be consumed during the formation of the gate dielectric layer 114a, and mechanical integrity issues or carrier mobility degradation may be prevented. In addition, the cap layer 112 may form a protruding portion adjacent to the isolation structure 110 and the S/D structure 118 may be formed over the protruding portion, which may prevent etching loss.

Figure 8A:
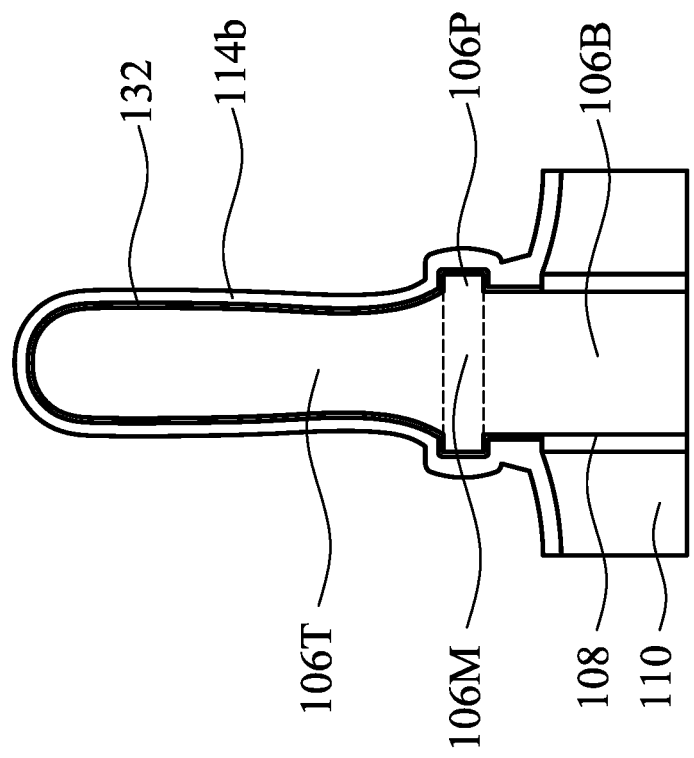
FIGS. 8A-8B are cross-sectional representations of various stages of forming a modified FinFET device structure, in accordance with some embodiments of the disclosure.
Figure 8B:
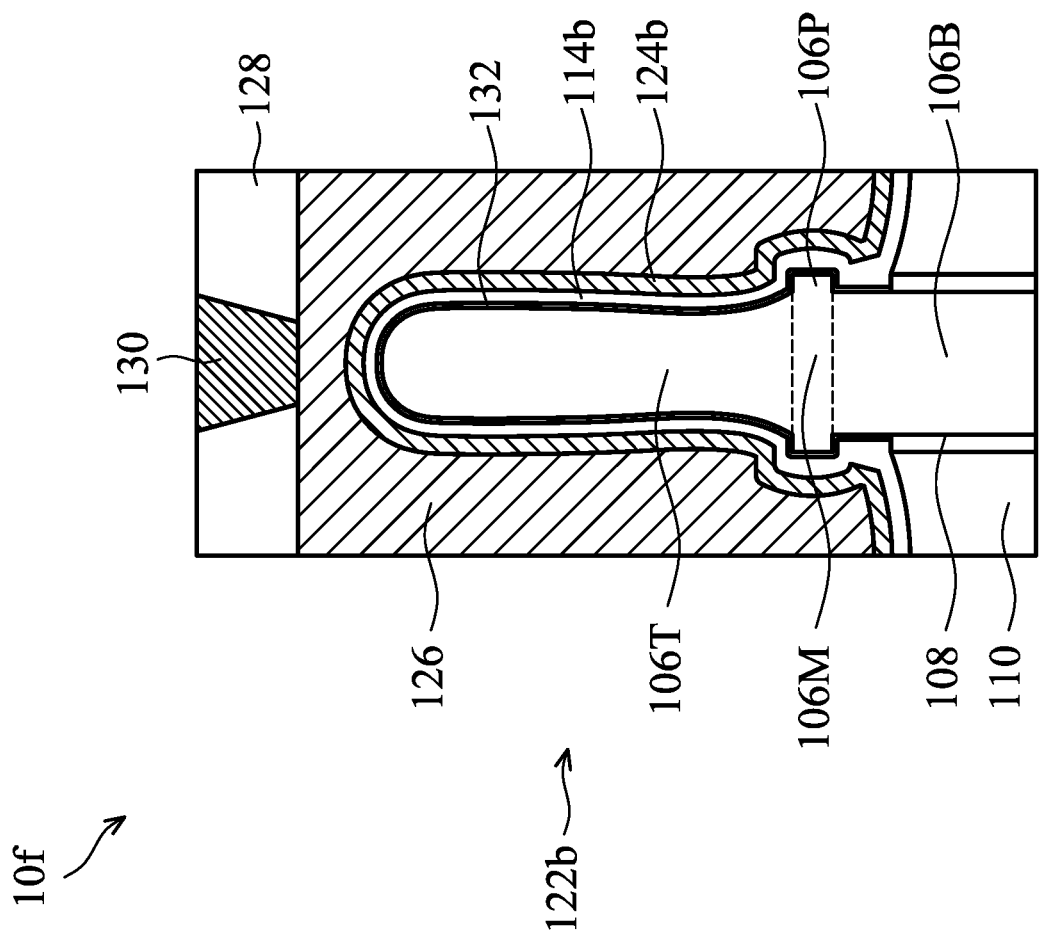

Many variations and/or modifications may be made to the embodiments of the disclosure. FIGS. 8A-8B are cross-sectional representations of various stages of forming a FinFET device structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8A, the gate dielectric layer 114a is removed after the removal of the dummy gate layer.

After the gate dielectric layer 114a is removed, the liner layer 108 and the isolation structure 110 are further vertically recessed. Therefore, the middle portion 106M of the fin structure 106 which has a protruding portion 106P protrudes from the sidewall is separated from the liner layer 108 and the fin structure 110.

Next, as shown in FIG. 8A, an interfacial layer 132 is conformally formed over the fin structure 106. The interfacial layer 132 may include silicon oxide. The silicon oxide may be formed by an oxidation process (such as a dry oxidation process, or a wet oxidation process), a deposition process (such as a chemical vapor deposition (CVD) process or an atomic layer deposition (ALD) process), other applicable processes, or a combination thereof. The interfacial layer 132 may be thermally grown using a thermal oxidation process in oxygen-containing ambient or nitrogen-containing ambient (e.g. NO or $N_2O$).

Next, as shown in FIG. 8A, a gate dielectric layer 114b may be formed over the interfacial layer 132, the liner layer 108, and the isolation structure 110. The gate dielectric layer 114b may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, $BaZrO$, $HfZrO$, $HfLaO$, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

In some embodiments as shown in FIG. 8A, since the protruding portion 106P of the fin structure 106 is separated from the liner layer 108 and the fin structure 106, the interfacial layer 132 and the gate dielectric layer 114b are sandwiched between the protruding portion 106P and the liner layer 108 and the isolation structure 110.

Next, as shown in FIG. 8B, a work function layer 124b is formed over the gate dielectric layer 114b. The material and the process of forming the work function layer 124b may be the same as, or similar to, the material and the process performed in the embodiment as shown in FIGS. 2F-1 and 2F-2. For the purpose of brevity, the descriptions of these processes are not repeated herein. However, it should be noted that, due to different demand of threshold voltage, the material or the thickness of work function layer 124b may be different from those of the work function layer 124a in the embodiment as shown in FIGS. 2F-1 and 2F-2.

Afterwards, the gate electrode layer 126 is formed over the work function layer 124b, and a gate structure 122b including the interfacial layer 132, the gate dielectric layer 114b, the work function layer 124b, and the gate electrode layer 126 may be formed, in the embodiment as shown in FIG. 8B. Next, a second ILD structure 128 is formed over the gate structure 122b, and a contact structure 130 is formed in the second ILD structure 128. The material and the process of forming the gate electrode layer 126, the second ILD structure 128, and the contact structure 130 may be the same as, or similar to, the process performed in the embodiment as shown in FIGS. 2F-1, 2F-2, 2G-1, and 2G-2. For the purpose of brevity, the descriptions of these processes are not repeated herein.

In some embodiments, the FinFET device structure 10f with gate structure 122b and the FinFET device structure 10a with gate structure 122a are formed at different region. For example, the FinFET device structure 10f with gate structure 122b may be a device in a core region, and the FinFET device structure 10a with gate structure 122a may be a device in an input/output (I/O) region.

By selectively growing a silicon cap layer 112 over the fin structure 106 before forming the gate dielectric layer 114b, the fin structure 106 may not be consumed during the formation of the gate dielectric layer 114a, and mechanical integrity issues or carrier mobility degradation may be prevented. In addition, the protruding portion 106P of the cap layer 106 is separated from the liner layer 108 and the isolation structure 110, which may help to identify the cap layer process with less fin structure 106 damage.

As described previously, a cap layer 106 is grown before forming the gate dielectric layer 114a or 114b, the fin structure 106 may not be consumed during the formation of the gate dielectric layer 114a or 114b. The cap layer 112 may form a protruding portion 106P of the fin structure 106, which may help to identify the cap layer process. The cap layer 106 may be selectively or non-selectively grown over the fin structure 106 with different protruding portion 106P sidewall profiles, and may be applied to devices in both I/O and core region.

Embodiments of a method for forming a FinFET device structure are provided. The method for forming the FinFET device structure may include growing a cap layer over the fin structure before forming the gate dielectric layer. The fin structure may not be consumed, and the mechanical integrity issues or carrier mobility degradation may be prevented. A laterally protruding portion of the cap layer may help to identify the process with less fin structure damage.

In some embodiments, a method for forming a fin field effect transistor device structure is provided. The method for forming a fin field effect transistor device structure includes forming a fin structure over a substrate. The method for forming a fin field effect transistor device structure also includes forming an isolation structure surrounding the fin structure. The method for forming a fin field effect transistor device structure also includes cleaning sidewalls of the fin structure. The method for forming a fin field effect transistor device structure also includes depositing a silicon cap layer over the fin structure. The method for forming a fin field effect transistor device structure also includes growing an oxide layer over the silicon cap layer. The silicon cap layer is thinned after growing an oxide layer over the silicon cap layer. The method for forming a fin field effect transistor device structure also includes forming a gate structure over the oxide layer across the fin structure. The method for forming a fin field effect transistor device structure also includes growing a source/drain epitaxial structure beside the gate structure. The method for forming a fin field effect transistor device structure also includes forming a contact structure electrically connected to the gate structure.

In some embodiments, a method for forming a fin field effect transistor device structure is provided. The method for forming a fin field effect transistor device structure includes forming a fin structure protruding from a substrate. The method for forming a fin field effect transistor device structure also includes forming a liner layer and an isolation structure surrounding the fin structure. The method for forming a fin field effect transistor device structure also includes recessing the liner layer and the isolation structure. The method for forming a fin field effect transistor device structure also includes growing a cap layer covering the fin structure. The method for forming a fin field effect transistor device structure also includes forming a first gate dielectric layer covering the cap layer, the liner layer, and the isolation structure. A portion of the cap layer is consumed. The method for forming a fin field effect transistor device structure also includes forming a gate structure over the first gate dielectric layer across the fin structure. The method for forming a fin field effect transistor device structure also includes growing source/drain epitaxial structures on opposite sides of the gate structure. The method for forming a fin field effect transistor device structure also includes forming a contact structure over the gate structure.

In some embodiments, a fin field effect transistor device structure is provided. The fin field effect transistor device structure includes a fin structure formed over a substrate. The fin field effect transistor device structure also includes a liner layer and an isolation structure surrounding the fin structure. The fin field effect transistor device structure also includes a gate dielectric layer formed over the fin structure and the isolation structure. The fin field effect transistor device structure also includes a gate structure formed over the gate dielectric layer. The fin field effect transistor device structure also includes source/drain epitaxial structures formed on opposite sides of the gate structure. The fin structure comprises a protruding portion laterally extending over the liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor device structure, comprising:
   forming a fin structure over a substrate;
   forming an isolation structure surrounding the fin structure;
   cleaning sidewalls of the fin structure;
   depositing a silicon cap layer over the fin structure;
   growing an oxide layer over the silicon cap layer, wherein the silicon cap layer is thinned after growing an oxide layer over the silicon cap layer;
   forming a gate structure over the oxide layer across the fin structure;
   growing a source/drain epitaxial structure beside the gate structure; and
   forming a contact structure electrically connected to the gate structure,
   wherein the silicon cap layer and the fin structure are made of the same material.

2. The method for forming the fin field effect transistor device structure as claimed in claim 1, further comprising:
   trimming the fin structure to narrow the fin structure,
   wherein the isolation structure is vertically recessed after trimming the fin structure.

3. The method for forming the fin field effect transistor device structure as claimed in claim 2, wherein after trimming the fin structure, the fin structure has a curved sidewall adjacent to the top surface of the isolation structure.

4. The method for forming the fin field effect transistor device structure as claimed in claim 1, wherein after cleaning the sidewalls of the fin structure, the fin structure has a protruding portion adjacent to the top surface of the isolation structure.

5. The method for forming the fin field effect transistor device structure as claimed in claim 1, further comprising:

forming an amorphous portion of the silicon cap layer over the isolation structure, wherein the amorphous portion of the silicon cap layer is in contact with the silicon cap layer over the fin structure.

6. The method for forming the fin field effect transistor device structure as claimed in claim 5, wherein while forming an amorphous portion of the silicon cap layer over the isolation structure, the silicon cap layer over the fin structure is crystallized.

7. The method for forming the fin field effect transistor device structure as claimed in claim 5, further comprising:
    re-crystallizing the amorphous portion of the silicon cap layer to a poly-crystalline portion of the silicon cap layer.

8. A method for forming a fin field effect transistor device structure, comprising:
    forming a fin structure protruding from a substrate;
    forming a liner layer and an isolation structure surrounding the fin structure;
    recessing the liner layer and the isolation structure;
    growing a cap layer over the fin structure;
    forming a first gate dielectric layer covering the cap layer, the liner layer, and the isolation structure, wherein a portion of the cap layer is consumed;
    forming a gate structure over the first gate dielectric layer across the fin structure;
    growing source/drain epitaxial structures on opposite sides of the gate structure; and
    forming a contact structure over the gate structure,
    wherein the cap layer and the fin structure are made of the same material.

9. The method for forming the fin field effect transistor device structure as claimed in claim 8, wherein the cap layer has a first thickness before forming a first gate dielectric layer, the cap layer has a second thickness after forming a first gate dielectric layer, and the first thickness is greater than the second thickness.

10. The method for forming the fin field effect transistor device structure as claimed in claim 8, wherein the cap layer has a protruding portion covering the liner layer and the isolation structure.

11. The method for forming the fin field effect transistor device structure as claimed in claim 8, wherein the source/drain epitaxial structures are formed over the cap layer adjacent to the isolation structure.

12. The method for forming the fin field effect transistor device structure as claimed in claim 8, further comprising:
    removing the first gate dielectric layer and recessing the liner layer and the isolation structure; and
    forming a second gate dielectric layer covering the fin structure and the isolation structure,
    wherein the cap layer protrudes from a sidewall of the fin structure.

13. A method for forming a fin field effect transistor device structure, comprising:
    forming a fin structure over a substrate;
    forming a liner layer and an isolation structure surrounding a bottom portion of the fin structure;
    cleaning the fin structure;
    forming a cap layer over the fin structure and the liner layer;
    depositing a gate dielectric layer over the cap layer and the isolation structure;
    forming a work function layer and a gate electrode layer over the gate dielectric layer across the fin structure; and
    forming a contact structure over the gate electrode layer,
    wherein a thickness of the cap layer is reduced after depositing the gate dielectric layer, and
    wherein the cap layer and the fin structure are made of the same material.

14. The method for forming the fin field effect transistor device structure as claimed in claim 13,
    wherein a sidewall of the cap layer is aligned with a sidewall of the liner layer after depositing the gate dielectric layer.

15. The method for forming the fin field effect transistor device structure as claimed in claim 13, wherein the liner layer and the isolation structure is recessed after cleaning the fin structure.

16. The method for forming the fin field effect transistor device structure as claimed in claim 13, further comprising:
    trimming the fin structure before cleaning the fin structure,
    wherein the liner layer and the isolation structure is recessed after trimming the fin structure.

17. The method for forming the fin field effect transistor device structure as claimed in claim 16, wherein the fin structure comprises a protruding portion after cleaning the fin structure, and the cap layer is formed over the protruding portion.

18. The method for forming the fin field effect transistor device structure as claimed in claim 16, wherein a middle portion of the fin structure is wider than a bottom portion of the fin structure.

19. The method for forming the fin field effect transistor device structure as claimed in claim 13, further comprising:
    removing the gate dielectric layer,
    wherein a protruding portion of the fin structure formed after removing the gate dielectric layer is separated from the liner layer.

20. The method for forming the fin field effect transistor device structure as claimed in claim 8, wherein the cap layer and the fin structure are made of silicon.

* * * * *